(12) United States Patent
    Lee

(10) Patent No.: US 12,575,304 B2
(45) Date of Patent: Mar. 10, 2026

(54) DISPLAY DEVICE HAVING TRANSMISSION LAYER WITH PORTIONS HAVING DIFFERENT TRANSMITTANCES AND ELECTRONIC DEVICE INCLUDING THE SAME

(71) Applicant: Samsung Display Co., Ltd., Yongin-si (KR)

(72) Inventor: Dukjin Lee, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 412 days.

(21) Appl. No.: 18/098,411

(22) Filed: Jan. 18, 2023

(65) Prior Publication Data
    US 2023/0329072 A1     Oct. 12, 2023

(30) Foreign Application Priority Data
    Mar. 18, 2022    (KR) ........................ 10-2022-0034126

(51) Int. Cl.
    *H10K 59/80*        (2023.01)
    *H10K 59/122*       (2023.01)
    *H10K 59/65*        (2023.01)

(52) U.S. Cl.
    CPC ....... *H10K 59/8792* (2023.02); *H10K 59/122* (2023.02); *H10K 59/65* (2023.02); *H10K 59/873* (2023.02)

(58) Field of Classification Search
    CPC .... H10K 59/00; H10K 59/121; H10K 59/122; H10K 59/126; H10K 59/35; H10K 59/40; H10K 59/65; H10K 59/873; H10K 59/8792; H10K 50/844; H10K 50/865
    See application file for complete search history.

(56) References Cited

U.S. PATENT DOCUMENTS

| | | | |
|---|---|---|---|
| 10,996,105 B2 | 5/2021 | Nagaya et al. | |
| 11,844,235 B2 | 12/2023 | Kim et al. | |
| 2010/0302194 A1 | 12/2010 | Park et al. | |
| 2015/0049030 A1* | 2/2015 | Her ...................... | G06F 3/0412 |
| | | | 345/173 |
| 2019/0310724 A1* | 10/2019 | Yeke Yazdandoost ..................... | |
| | | | G06F 3/042 |

(Continued)

FOREIGN PATENT DOCUMENTS

| | | |
|---|---|---|
| JP | 2021015298 A | 2/2021 |
| KR | 101045265 B1 | 6/2011 |

(Continued)

OTHER PUBLICATIONS

Machine translation of CN 202111597544 A (Year: 2022).*

*Primary Examiner* — Britt D Hanley
(74) *Attorney, Agent, or Firm* — CANTOR COLBURN LLP

(57)     ABSTRACT

A display device includes: a display panel including a display region having a first region and a second region positioned adjacent to the first region, and a peripheral region positioned adjacent to the display region; a light blocking pattern overlapping at least a portion of the second region and not overlapping the first region; and a transmission layer disposed on the light blocking pattern and including a first portion overlapping the first region and a second portion overlapping the second region, where a transmittance of the first portion is lower than a transmittance of the second portion.

20 Claims, 13 Drawing Sheets

(56)  References Cited

U.S. PATENT DOCUMENTS

| 2020/0310210 A1* | 10/2020 | Zhang | H10K 59/50 |
| 2021/0233977 A1* | 7/2021 | Yang | H04M 1/0266 |
| 2022/0011489 A1* | 1/2022 | Kim | H10K 59/8791 |
| 2022/0130935 A1* | 4/2022 | Kim | H10K 50/865 |
| 2024/0373565 A1* | 11/2024 | Liu | H05K 5/02 |

FOREIGN PATENT DOCUMENTS

| KR | 1020170099460 A | 9/2017 |
| KR | 1020210105782 A | 8/2021 |

* cited by examiner

FIG. 12

DISPLAY DEVICE HAVING TRANSMISSION LAYER WITH PORTIONS HAVING DIFFERENT TRANSMITTANCES AND ELECTRONIC DEVICE INCLUDING THE SAME

This application claims priority to Korean Patent Application No. 10-2022-0034126, filed on Mar. 18, 2022, and all the benefits accruing therefrom under 35 U.S.C. § 119, the content of which in its entirety is herein incorporated by reference.

BACKGROUND

1. Field

The disclosure herein relates to a display device and an electronic device including the display device, and more particularly, to a display device having improved visibility by preventing a boundary between regions from being visually perceived, and an electronic device including the display device.

2. Description of the Related Art

Electronic devices may be devices that include various electronic components, such as a display panel for displaying images, and an electronic module for serving various functions. The display panel includes light emitting elements that generate light.

The electronic module may include cameras, infrared sensors, proximity sensors, and the like. The electronic module may be disposed below a display area of the display panel. The transmittance of a portion of the display area of the display panel may be greater than the transmittance of the other portions of the display area of the display panel. The electronic module may receive or output light signals through the portion of the display area having greater transmittance.

SUMMARY

The disclosure provides a display device that may have improved visibility by preventing a boundary between a region in which electronic modules such as sensors and cameras are disposed and a region placed adjacent thereto from being visually perceived from the outside, and an electronic device including the display device.

An embodiment of the invention provides a display device that includes: a display panel including a display region having a first region and a second region positioned adjacent to the first region, and a peripheral region positioned adjacent to the display region; a light blocking pattern overlapping at least a portion of the second region and not overlapping the first region; and a transmission layer disposed on the light blocking pattern and including a first portion overlapping the first region and a second portion overlapping the second region, where a transmittance of the first portion is lower than a transmittance of the second portion.

In an embodiment, the display device may further include an anti-reflection layer disposed between the transmission layer and the light blocking pattern. In an embodiment, the transmittance of the first portion is defined as a first transmittance, the transmittance of the second portion is defined as a second transmittance, a reflectance of the first portion is defined as a first reflectance, a reflectance of the second portion is defined as a second reflectance, and the first transmittance and the second transmittance may satisfy the following equation: $T1(\%)=\sqrt{(R2(\%)/R1(\%))}\times T2(\%)$ where T1 denotes the first transmittance, T2 denotes the second transmittance, R1 denotes the first reflectance, and R2 denotes the second reflectance.

In an embodiment, a ratio of the first transmittance to the second transmittance may be in a range of about 0.6 to about 0.9.

In an embodiment, the first portion may have a circular shape when viewed on a plane, and the transmittance of the first portion may increase as being away from a center of the first portion towards the second portion.

In an embodiment, the display device may further include a window disposed on the transmission layer, a first adhesive layer disposed between the window and the transmission layer, and a second adhesive layer disposed between the transmission layer and the display panel.

In an embodiment, the display panel may include a base layer, a plurality of pixels disposed on the base layer, where the plurality of pixels may emit light in the display region, and an encapsulation layer disposed on the base layer and covering the plurality of pixels, wherein the light blocking pattern may be disposed below the encapsulation layer.

In an embodiment, the display panel may further include a sensor layer disposed on the encapsulation layer, where the sensor layer may include a plurality of conductive patterns and at least one sensing insulating layer disposed between the conductive patterns.

In an embodiment, the plurality of pixels includes a plurality of light emitting elements, the display panel may further include a pixel defining film, in which a plurality of light emitting openings is defined, where the plurality of light emitting elements may be disposed in the plurality of light emitting openings, and the light blocking pattern may be disposed to overlap the pixel defining film in the second region.

In an embodiment, the pixel defining film may include a first pixel defining portion overlapping the first region, and a second pixel defining portion overlapping the second region, wherein the light blocking pattern may not overlap the first pixel defining portion and overlap the second pixel defining portion.

In an embodiment, the plurality of pixels may include a first pixel including a first light emitting element disposed in the first region, and a second pixel including a second light emitting element disposed in the second region, where a number of the first light emitting elements per unit area may be less than a number of the second light emitting elements per unit area.

In an embodiment, a reflectance corresponding to the first region and a reflectance corresponding to the second region may be substantially equal to each other.

In an embodiment, the first portion and the second portion may be integrally formed with each other as a single unitary an indivisible body.

In an embodiment of the invention, a display device includes: a display panel including a display region having a first region and a second region positioned adjacent to the first region, and a peripheral region positioned adjacent to the display region; a light blocking pattern overlapping at least a portion of the second region; an anti-reflection layer disposed on the light blocking pattern; a transmission layer disposed on the anti-reflection layer and including a first portion overlapping the first region and a second portion overlapping the second region; and a window disposed on the transmission layer, where a transmittance of the first portion is lower than a transmittance of the second portion.

In an embodiment, the display panel may include a base layer, a plurality of pixels disposed on the base layer, wherein the plurality of pixels may emit light in the display region, and an encapsulation layer disposed on the base layer and covering the plurality of pixels, where the light blocking pattern may be disposed below the encapsulation layer.

In an embodiment, the display panel may further include a sensor layer disposed on the encapsulation layer, where the sensor layer may include a plurality of conductive patterns and at least one sensing insulating layer disposed between the conductive patterns.

In an embodiment of the invention, an electronic device includes: a display device including a display region having a first region through which light signals pass and a second region positioned adjacent to the first region, and a peripheral region positioned adjacent to the display region; and an electronic module disposed below the display device and overlapping the first region, where the electronic module receives the light signals, where the display device includes: a display panel, and a peripheral region positioned adjacent to the display region; a light blocking pattern overlapping at least a portion of the second region; and a transmission layer disposed on the light blocking pattern and including a first portion overlapping the first region and a second portion overlapping the second region, where a transmittance of the first portion is lower than a transmittance of the second portion.

In an embodiment, the electronic module may include a camera module.

In an embodiment, the display device may further include: an anti-reflection layer disposed between the transmission layer and the light blocking pattern; a window disposed on the transmission layer; a first adhesive layer disposed between the window and the transmission layer; and a second adhesive layer disposed between the transmission layer and the anti-reflection layer.

In an embodiment, the transmittance of the first portion is defined as a first transmittance, the transmittance of the second portion is defined as a second transmittance, and a ratio of the first transmittance to the second transmittance may be in a range of about 0.6 to about 0.9.

BRIEF DESCRIPTION OF THE DRAWINGS

The accompanying drawings are included to provide a further understanding of embodiments of the invention, and are incorporated in and constitute a part of this specification. The drawings illustrate embodiments of the invention and, together with the description, serve to explain principles of the invention. In the drawings:

FIGS. 12 and 13 are each a cross-sectional view showing a portion of a display device according to an embodiment of the invention.

DETAILED DESCRIPTION

Figure 1:
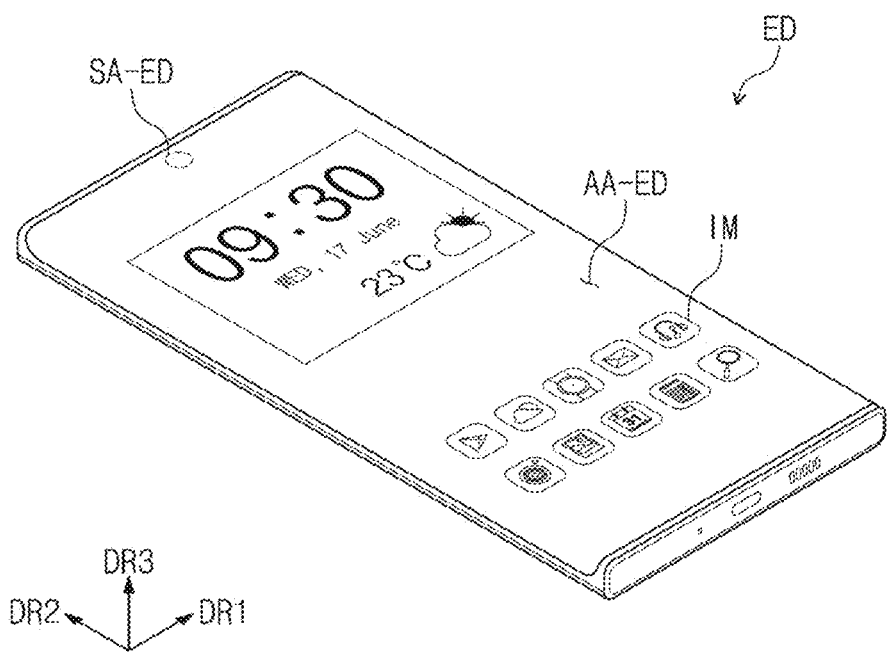
FIG. 1 is a perspective view of an electronic device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element (or a region, a layer, a portion, or the like) is referred to as "being on", "connected to" or "coupled to" another element, it can be directly disposed on, connected or coupled to the other element, or intervening elements may be disposed therebetween.

Like reference numerals refer to like elements. In addition, in the drawings, the thickness, the ratio, and the dimensions of elements are exaggerated for an effective description of technical contents. "Or" means "and/or." The term "and/or," includes all combinations of one or more of which associated configurations may define.

It will be understood that, although the terms first, second, etc. may be used herein to describe various elements, these elements should not be limited by these terms. These terms are only used to distinguish one element from another element. For example, a first element may be referred to as a second element, and similarly, a second element may be referred to as a first element without departing from the teachings of the disclosure. The singular forms are intended to include the plural forms as well, unless the context clearly indicates otherwise.

Also, terms of "below", "on lower side", "above", "on upper side", or the like may be used to describe the relationships of the components illustrated in the drawings. The terms are used as a relative concept and are described with reference to the direction indicated in the drawings.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

As used herein, being "disposed directly on" may mean that there is no additional layer, film, region, plate, or the like between a part and another part such as a layer, a film, a region, a plate, or the like. For example, being "disposed directly on" may mean that two layers or two members are disposed without using an additional member such as an adhesive member, therebetween.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +30%, 20%, 10% or 5% of the stated value.

Unless otherwise defined, all terms (including technical and scientific terms) used herein have the same meaning as commonly understood by one of ordinary skill in the art to which the disclosure belongs. In addition, terms, such as those defined in commonly used dictionaries, should be interpreted as having a meaning that is consistent with their meaning in the context of the relevant art and should not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 2:
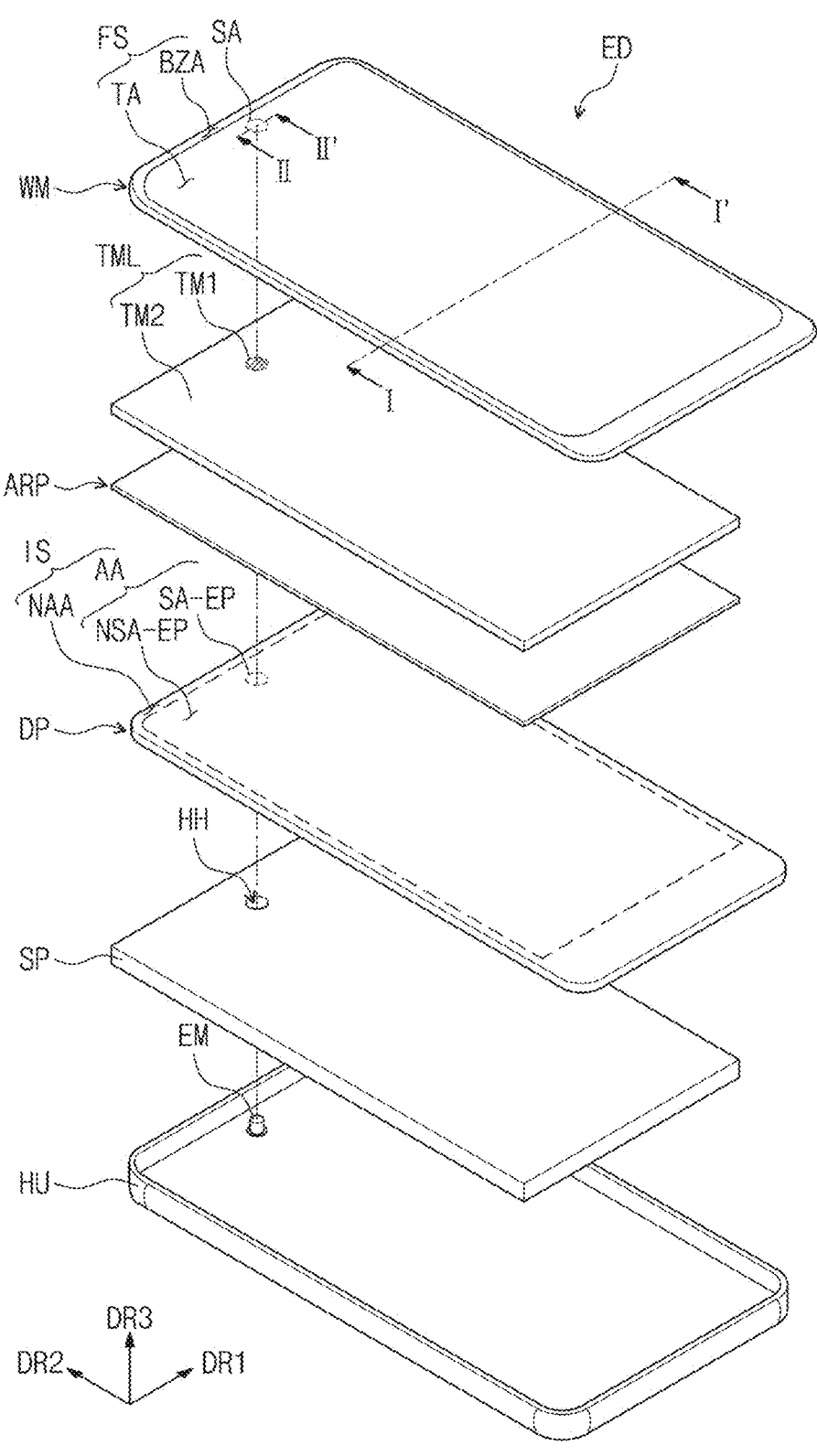
FIG. 2 is an exploded perspective view of an electronic device according to an embodiment of the invention.
Figure 3:
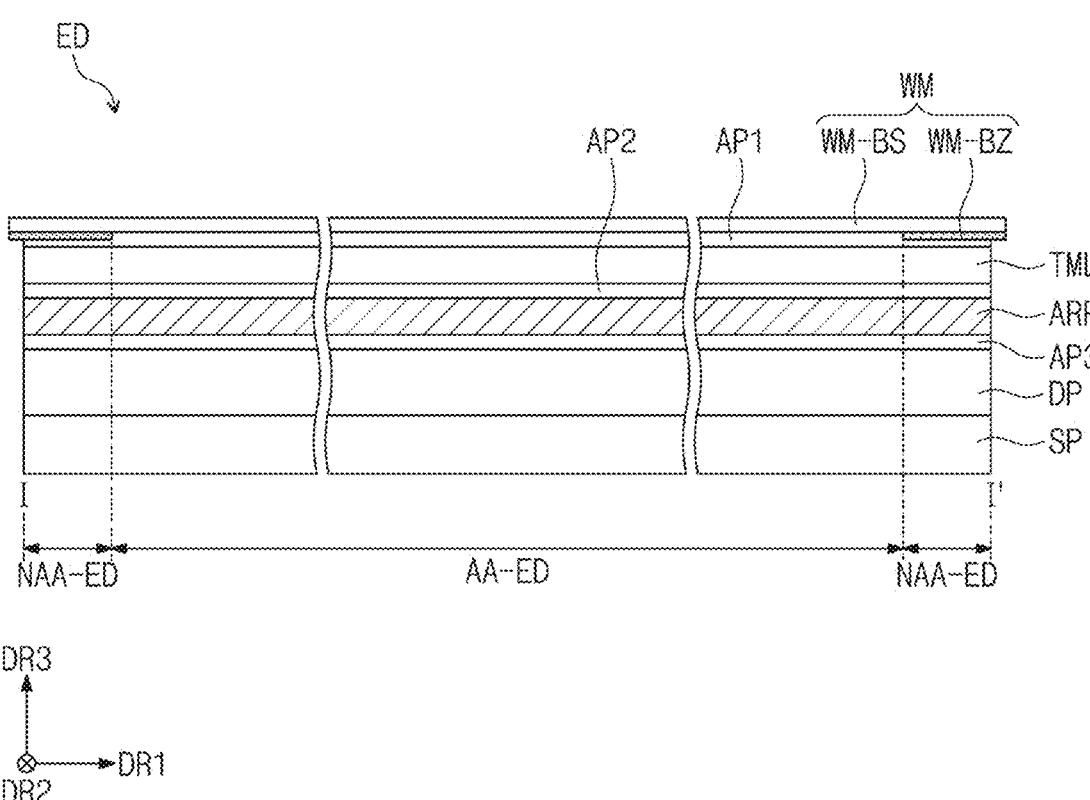
FIGS. 3 and 4 are each a cross-sectional view of an electronic device according to an embodiment of the invention.
Figure 4:
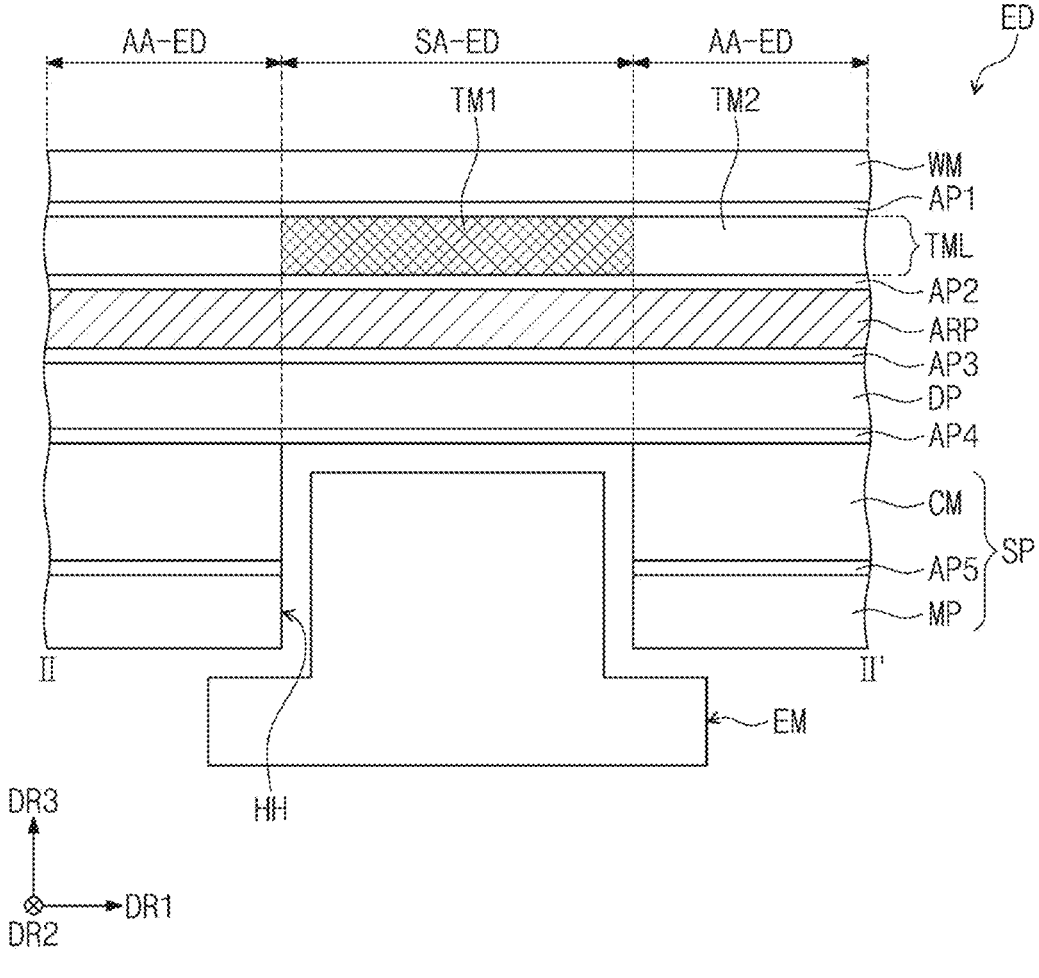

FIG. 1 is a perspective view of an electronic device according to an embodiment of the invention, FIG. 2 is an exploded perspective view of an electronic device according to an embodiment of the invention, and FIGS. 3 and 4 are each a cross-sectional view of an electronic device according to an embodiment of the invention. FIG. 3 is a cross-sectional view corresponding to line I-I' of FIG. 2. FIG. 4 is a cross-sectional view of a portion corresponding to line II-II' of FIG. 2.

An embodiment of an electronic device ED may be a device activated according to electrical signals. In an embodiment, for example, the electronic device ED may be a mobile phone, a tablet, a car navigation system, a game console, or a wearable device, but is not limited thereto. In FIG. 1, an embodiment where the electronic device ED is a mobile phone is shown.

The electronic device ED may display an image IM through an active region AA-ED. The active region AA-ED may include a plane (or a surface on a plane) defined by a first direction DR1 and a second direction DR2. The active region AA-ED may further include a curved surface bent from at least one side of the plane defined by the first direction DR1 and the second direction DR2. An embodiment of the electronic device ED, as shown in FIG. 1, may include two curved surfaces each bent from both sides of the plane defined by the first direction DR1 and the second direction DR2. However, the shape of the active region AA-ED is not limited thereto. In an alternative embodiment, for example, the active region AA-ED may include only the plane, and the active region AA-ED may further include curved surfaces each bent from at least two sides of the plane (e.g., four curved surfaces each bent from four sides of the plane).

FIG. 1 and the following drawings show the first to third directions DR1 to DR3, and directions indicated by the first to third directions DR1, DR2, and DR3 described herein are relative concepts, and may thus be changed to other directions.

The first direction DR1 and the second direction DR2 herein may be perpendicular to each other, and the third direction DR3 may be a normal direction to a plane defined by the first direction DR1 and the second direction DR2. Meanwhile, as used herein, "on a plane" may refer to when viewed on a plane defined by the first direction DR1 and the second direction DR2, and a thickness direction may refer to the third direction DR3 which is a normal direction to the plane defined by the first direction DR1 and the second direction DR2.

A sensing region SA-ED may be defined in the active region AA-ED of the electronic device ED. In FIG. 1, one sensing region SA-ED is shown as an example, but the number of sensing region SA-ED is not limited thereto. The sensing region SA-ED may be a portion of the active region AA-ED. The electronic device ED may display images through the sensing region SA-ED.

An electronic module EM may be disposed in a region overlapping the sensing region SA-ED. The electronic module EM may receive external inputs delivered through the sensing region SA-ED or provide outputs through the sensing region SA-ED. The electronic module EM may be, for example, a camera module or a sensor module.

Referring to FIGS. 1 to 4, an embodiment of the electronic device ED may include an active region AA-ED and a peripheral region NAA-ED adjacent to the active region AA-ED. The active region AA-ED may correspond to a display region DP-A of the display panel DP (shown in FIG. 8), and the peripheral region NAA-DD may correspond to a non-display region DP-NA of the display panel DP (shown in FIG. 8).

The peripheral region NAA-DD, as a region that blocks light signals, may be a portion disposed outside the active region AA-ED to surround the active region AA-ED. In an embodiment, the peripheral region NAA-ED may be disposed on a side surface of the electronic device ED instead of a front surface thereof. In an embodiment, the peripheral region NAA-ED may be omitted.

The electronic device ED according to an embodiment may include an electronic module EM, a display panel DP disposed on an upper side (or surface) of the electronic module EM, an anti-reflection layer ARP disposed on an upper side of the display panel DP, and a transmission layer TML disposed on the anti-reflection layer ARP. In addition, a support member SP may be disposed below the display panel DP, and a through hole HH overlapping the electronic module EM may be defined in the support member SP.

The electronic device ED according to an embodiment may include a window WM disposed on the display panel DP. In addition, the electronic device ED according to an embodiment may include a housing HU disposed below the display panel DP. The electronic module EM and the display panel DP may be accommodated in the housing HU. In the electronic device ED according to an embodiment, the window WM and the housing HU may be combined together to form an exterior of the electronic device ED.

The electronic device ED according to an embodiment may include at least one adhesive layer AP1 to AP5. Some of the at least one adhesive layer AP1 to AP5 may be an optically clear adhesive layer. In addition, some of the at least one adhesive layer AP1 to AP5 may be omitted.

In the electronic device ED according to an embodiment, the electronic module EM may be an electronic component for outputting or receiving light signals. In an embodiment, for example, the electronic module EM may be a camera module configured to photograph external images. In addition, the electronic module EM may be a sensor module such as a proximity sensor or an infrared light emitting sensor.

In the electronic device ED according to an embodiment, the display panel DP may be disposed on the electronic module EM. The display panel DP may include an active region AA for displaying the image IM and a non-display region NAA placed adjacent to the active region AA. That is, a front surface IS of the display panel DP may include the active region AA and the non-display region NAA. The active region AA may be a portion activated according to electrical signals.

The non-display region NAA may be placed adjacent to the active region AA. The non-display region NAA may surround the display region AA. A driving circuit or driving wiring for driving the active region AA, various signal lines or pads for providing electric signals to the active region AA, or electronic elements may be disposed in the non-display region NAA.

The display panel DP may include a first region SA-EP and a second region NSA-EP. The first region SA-EP may be a portion overlapping the electronic module EM, and the second region NSA-EP may be a portion disposed to surround at least a portion of the first region SA-EP. The first region SA-EP may correspond to the sensing region SA-ED of the electronic device ED. The second region NSA-EP may be a portion corresponding to a region other than the sensing region SA-ED in the active region AA-ED.

When viewed on a plane (or in a top plan view or in the third direction DR3), the first display region SA-EP may be smaller in size than the second display region NSA-EP. The first region SA-EP may have a transmittance different from that of the second region NSA-EP. The first region SA-EP may have a transmittance greater than that of the second region NSA-EP.

In the display panel DP according to an embodiment, a portion of a driving circuit or driving wiring for driving a pixel PX (shown in FIG. 7) disposed in the first region SA-EP may be disposed in the non-display region NAA or a portion of the second region NSA-EP adjacent to the first region SA-EP. Accordingly, the wiring density in the first region SA-EP may be lower than the wiring density in the second region NSA-EP. However, the embodiment of the invention is not limited thereto, and the wiring density in the first region SA-EP and the wiring density in the second region NSA-EP may be substantially equal to each other.

In an embodiment, the display panel DP may include a light emitting element layer DP-ED (shown in FIG. 5) including an organic light emitting element, a quantum dot light emitting element, a micro LED light emitting element, or a nano LED light emitting element. The light emitting element layer DP-ED (shown in FIG. 5) may be configured to substantially generate images.

In the electronic device ED according to an embodiment, an anti-reflection layer ARP may be disposed on an upper side of the display panel DP. The anti-reflection layer ARP may be disposed between the display panel DP and the transmission layer TML. The anti-reflection layer ARP may serve an anti-reflection function for reducing reflection of external light, that is, light incident from an outside the electronic device ED. In an embodiment, the anti-reflection layer ARP may be a polarizing plate. However, the embodiment of the invention is not limited thereto, and the anti-reflection layer ARP may be a color filter layer including a plurality of color filters and a light blocking unit.

In the electronic device ED according to an embodiment, the transmission layer TML may be disposed on an upper side of the anti-reflection layer ARP. The transmission layer TML may be disposed between the anti-reflection layer ARP and the window WM. The transmission layer TML may be a layer configured to compensate for a difference in reflectance between the sensing region SA-ED and a region other than the sensing region SA-ED in the active region AA-ED of the electronic device ED. The transmission layer TML may include a first portion TM1 corresponding to the sensing region SA-ED and a second portion TM2 corresponding to the region other than the sensing region SA-ED. The transmission layer TML may be an optically transparent polymer film. In an embodiment, the transmission layer TML may include or be defined by a polyethylene terephthalate (PET) film or a polyimide (PI) film.

In the electronic device ED according to an embodiment, the first portion TM1 and the second portion TM2 of the transmission layer TML may have different transmittances from each other. In the transmission layer TML, the first portion TM1 may have a transmittance lower than that of the second portion TM2.

In an embodiment, the first portion TM1 and the second portion TM2 may be in the form of a singly body or integrally formed as a single unitary and indivisible body. In such an embodiment, the first portion TM1 and the second portion TM2 may form a single layer that is not separate, and may only have different transmittances from each other.

In an embodiment, when the transmittance of the first portion TM1 is defined as a first transmittance, the transmittance of the second portion TM2 is defined as a second transmittance, reflectance of the first portion TM1 is defined as a first reflectance, and reflectance of the second portion TM2 is defined as a second reflectance, the first transmittance and the second transmittance may satisfy Equation 1 below.

$$T1(\%)=\sqrt{(R2(\%)/R1(\%))}\times T2(\%) \qquad \text{[Equation 1]}$$

In Equation 1 above, T1 denotes the first transmittance, T2 denotes the second transmittance, R1 denotes the first reflectance, and R2 denotes the second reflectance.

In an embodiment, the value of the first transmittance versus the second transmittance (i.e., a ratio of the first transmittance to the second transmittance) may be in a range of about 0.6 to about 0.9. In an embodiment, for example, the value of the first transmittance versus the second transmittance may in a range of be about 0.7 to about 0.75. In the electronic device ED according to an embodiment of the invention, the value of the first transmittance versus the second transmittance is designed or determined to be in the range of about 0.6 to about 0.9, and reflectance of the sensing region SA-ED overlapping the first portion TM1 and reflectance of the remaining region overlapping the second portion TM2 in the active region AA-ED may thus be controlled to be substantially equal to each other. In the electronic device ED according to an embodiment of the invention, as the transmission layer TML having the first portion TM1 and the second portion TM2, which are different in transmittance is included, and thus even when the first region SA-EP and the second region NSA-EP of the display panel DP have different reflectance's and transmittances from each other, a reflectance of the sensing region SA-ED overlapping thereof and a reflectance of the region other than the sensing region SA-ED in the active region AA-ED may be controlled to be substantially equal to each other, which will be described later in greater detail. Herein, when "substantially equal" in regard to reflectance includes not only a case where the reflectance is physically equal, but also a case where the reflectance is equal within the margin of error may be seen in a process despite the same design.

Referring to FIGS. 2 to 4, a support member SP may be disposed below the display panel DP. The support member SP may include a cushion layer CM and a metal support layer MP. In addition, the support member SP may further include at least one adhesive layer AP5. The adhesive layer AP5 may be an optically transparent adhesive layer.

A through hole HH may be defined in the support member SP. The through hole HH may be defined to pass through the cushion layer CM and the metal support layer MP. In addition, similarly, the through hole HH may be defined to pass through the adhesive layer AP5 included in the support member SP.

The through hole HH may be defined to be disposed in the display region AA of the display panel DP. In the electronic device ED, the first region SA-EP of the display panel DP may be a portion corresponding to the through hole HH. The through hole HH may be a portion corresponding to the sensing region SA-ED of the electronic device ED.

The electronic module EM may overlap the through hole HH. At least a portion of the electronic module EM may be disposed to be inserted into the through hole HH. In an embodiment, for example, the electronic module EM may be a camera module including a lens, which is placed adjacent to the display panel DP. In an embodiment, the lens of the camera module may be disposed to be inserted into the through hole HH.

The cushion layer CM may be provided to protect the display panel DP and the electronic module EM against physical shocks applied from the outside of the electronic device ED. In addition, the cushion layer CM may be provided to have a predetermined thickness or greater to obtain the through hole HH. The cushion layer CM may have a thickness of about 50 micrometers ($\mu$m) or greater. In an embodiment, for example, the cushion layer CM may have a thickness of about 100 $\mu$m or greater.

The cushion layer CM may include or be formed of at least one selected from an acrylic polymer, a urethane-based polymer, a silicone-based polymer, and an imide-based polymer. The cushion layer CM may include a material having a predetermined strength to protect the display panel DP, the electronic module EM, and the like, and to prevent the cushion layer CM from being damaged even when the through hole HH is defined or formed through the support member SP.

An adhesive layer AP4 may be disposed on the cushion layer CM. The adhesive layer AP4 may bond the cushion layer CM with the display panel DP.

The metal support layer MP may be a support substrate that supports members included in the electronic device ED such as the display panel DP. The metal support layer MP may be a thin film metal substrate. The metal support layer MP may serve a function such as heat dissipation or electromagnetic wave shielding.

In the electronic device ED according to an embodiment, the support member SP may further include a panel support portion (not shown). The panel support portion (not shown) may be disposed below the display panel DP. The panel support (not shown) may be disposed between the display panel DP and the cushion layer CM. The panel support portion (not shown) may include a polymer film. The polymer film may be an optically transparent polyethylene terephthalate (PET) film.

In an embodiment, the support member SP may further include an adhesive layer that bonds the panel support portion (not shown) with the display panel DP, and in such an embodiment, the adhesive layer may be an optically transparent adhesive layer.

In the electronic device ED according to an embodiment, the window WM may be disposed on the transmission layer TML. The window WM may cover the front surface IS of the display panel DP. The window WM may include a base substrate WM-BS and a bezel pattern WM-BZ.

The base substrate WM-BS may be a substrate including an optically transparent insulating material. The base substrate WM-BS may be flexible. In an embodiment, for example, the base substrate WM-BS may include a polymer film, a substrate having a polymer material, or a thin film glass substrate. The base substrate WM-BS may correspond to a substrate having no phase difference or a fairly low phase difference, that is, having a substantially constant phase overall. Functional layers such as an anti-reflection layer, an anti-fingerprint layer, and an optical layer for controlling a phase may be further disposed on the base substrate WM-BS.

The bezel pattern WM-BZ may be a color layer printed on one surface of the base substrate WM-BS or a color layer deposited on the base substrate WM-BS. In an embodiment, for example, the bezel pattern WM-BZ may have aa multilayer structure. The multilayer structure may include a colored color layer and a black light blocking layer. The colored color layer and the black light blocking layer may be formed through deposition, printing, and coating processes. The bezel pattern WM-BZ may be omitted, and may be provided or formed on functional layers other than the base substrate WM-BS.

The window WM includes an upper surface FS exposed to the outside. The upper surface FS of the electronic device ED may be substantially defined by an upper surface FS of the window WM. In the upper surface FS of the window WM, the transmission region TA may be an optically transparent region. The transmission region TA may be in the form corresponding to the display region AA of the display panel DP. In an embodiment, for example, the transmission region TA overlaps a front surface or at least a portion of the display region AA. Images displayed in the display region AA of the display panel DP may be viewed from the outside through the transmission region TA.

In an embodiment, the bezel region BZA may be a portion of the upper surface FS of the window WM which is provided with or overlapping the bezel pattern WM-BZ. The bezel region BZA may define the shape of the transmission region TA. The bezel region BZA may be adjacent to the transmission region TA and surround the transmission region TA. The bezel region BZA may cover the non-display region NAA of the display panel DP to prevent the non-display region NAA from being viewed from the outside.

A sensing region SA may be defined in the transmission region TA of the window WM. The sensing region SA of the window may be defined as the sensing region SA-ED of the electronic device ED.

The electronic device ED according to an embodiment may further include a first adhesive layer AP1 disposed between the window WM and the transmission layer TML, and a second adhesive layer AP2 disposed between the transmission layer TML and the anti-reflection layer ARP. Each of the first adhesive layer AP1 and the second adhesive layer AP2 may be an optically transparent adhesive layer. The electronic device ED according to an embodiment may further include a third adhesive layer AP3 disposed between the anti-reflection layer ARP and the display panel DP. The third adhesive layer AP3 may be an optically transparent adhesive layer. In an embodiment, the third adhesive layer AP3 may be omitted.

Figure 5:
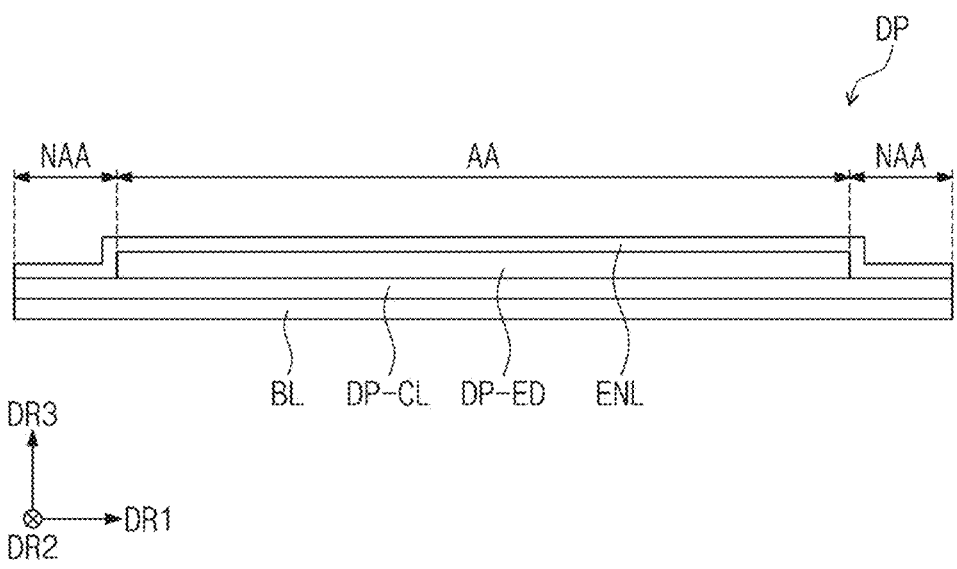
FIG. 5 is a cross-sectional view of a display panel according to an embodiment of the invention.
Figure 6:
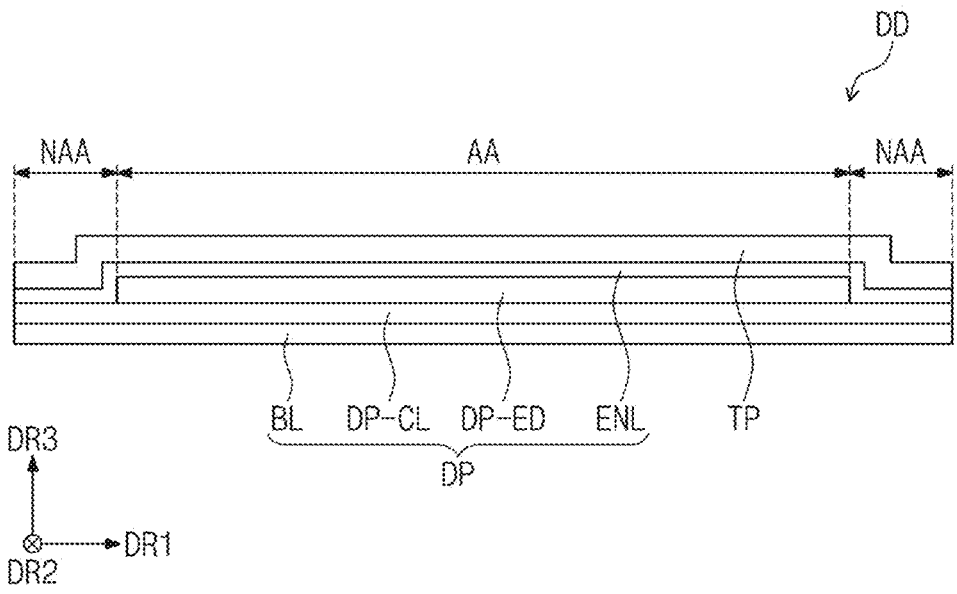
FIG. 6 is a cross-sectional view of a display device according to an embodiment of the invention.

FIG. 5 is a cross-sectional view of a display panel according to an embodiment, and FIG. 6 is a cross-sectional view of a display device according to an embodiment.

In an embodiment, the display panel DP includes a base layer BL, a circuit layer DP-CL disposed on the base layer BL, a light emitting element layer DP-ED, and an encapsulation layer ENL. The base layer BL may include a plastic substrate, a glass substrate, a metal substrate, an organic/inorganic composite material substrate, or the like. In an embodiment, for example, the base layer BL may include at least one polyimide layer.

The circuit layer DP-CL includes at least one insulating layer, semiconductor patterns, and conductive patterns. The insulating layer include at least one inorganic layer and at least one organic layer. The semiconductor patterns and conductive patterns may constitute signal lines, a pixel driving circuit, and a scan driving circuit. In addition, the circuit layer DP-CL may include rear metal layers BMLa and BMLb (shown in FIG. 10). The configuration of the circuit layer DP-CL will be described later in greater detail.

Figure 12:
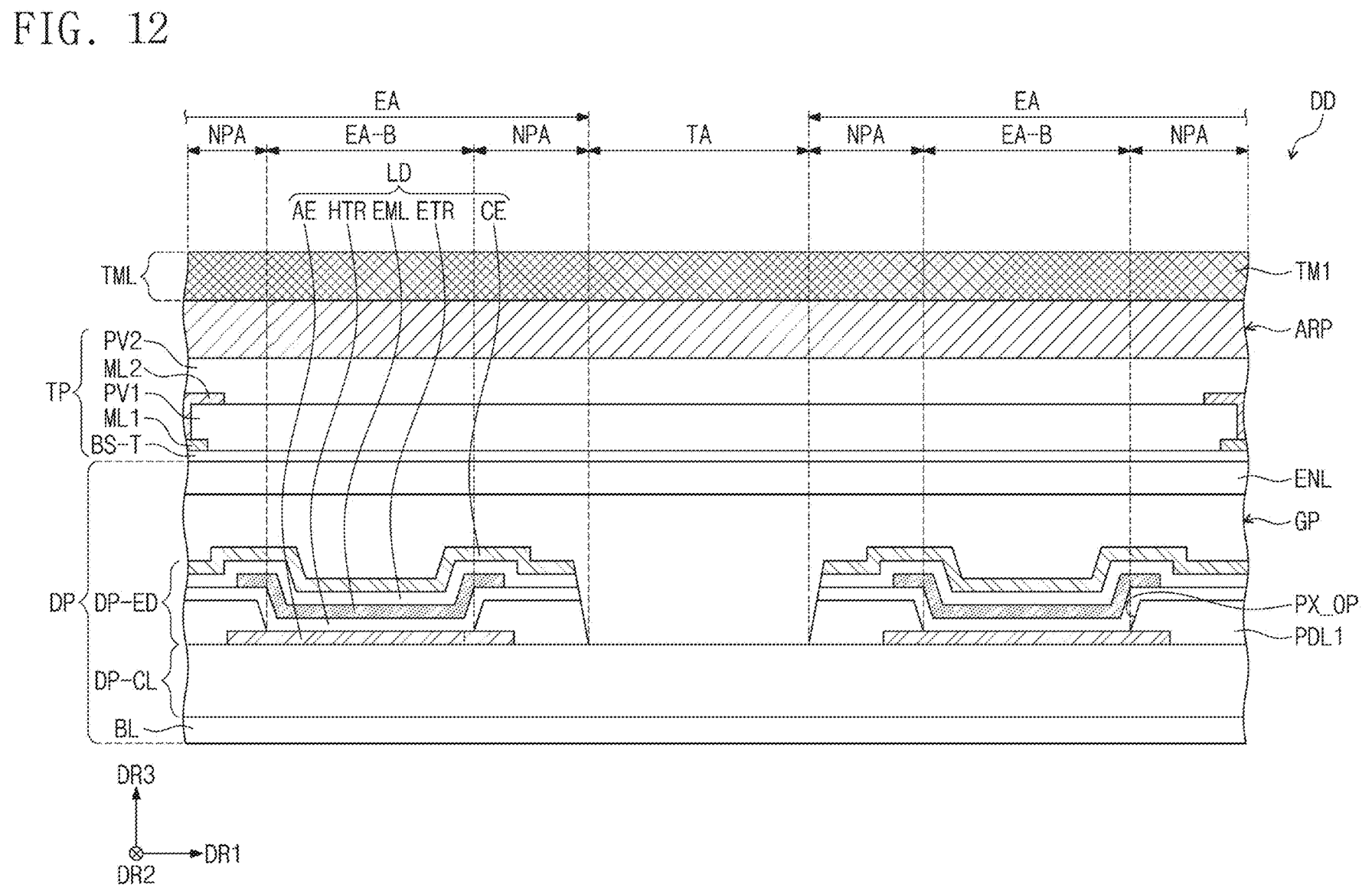

The light emitting element layer DP-ED includes a display element, for example, a light emitting element LD (shown in FIG. 12). The light emitting element layer DP-ED may further include an organic layer such as a pixel defining film.

The light emitting element layer DP-ED may be disposed in the display region AA. The non-display region NAA may be disposed outside the display region AA to surround the display region AA, and a light emitting element may not be disposed in the non-display region NAA.

An encapsulation layer ENL is disposed on the light emitting element LD to cover the light emitting element LD. The encapsulation layer ENL may be spaced apart from the light emitting element LD with a predetermined space therebetween to encapsulate the light emitting element LD. The space may be filled with air, an inert gas, or an adhesive material. The encapsulation layer ENL may be a glass substrate provided in the form of an encapsulation substrate. Accordingly, the display device DD including the encapsulation layer ENL may be a rigid display device DD. However, the embodiment of the invention is not limited thereto, and alternatively, the encapsulation layer ENL may be a thin film encapsulation layer including a plurality of organic thin films and inorganic thin films. The encapsulation layer ENL may include a thin film encapsulation layer having a stack structure of an inorganic layer/organic layer/inorganic layer.

The display device according to an embodiment may further include a sensor layer TP disposed on the display panel DP. The sensor layer TP may detect external inputs applied from the outside. The external inputs may be a user's inputs. The user's inputs may include various types of external inputs such as a part of a user's body, light, heat, pen, or pressure.

In an embodiment, the sensor layer TP may be formed on the encapsulation layer ENL through a roll-to-roll process. In such an embodiment, the sensor layer TP may be indicated as being directly disposed on the encapsulation layer ENL. Here, "being directly disposed" may indicate that a third component is not disposed between the sensor layer TP and the encapsulation layer ENL. That is, a separate adhesive member may not be disposed between the sensor layer TP and the encapsulation layer ENL. However, the embodiment is not limited thereto, and alternatively, an adhesive member (not shown) may be further disposed between the sensor layer TP and the encapsulation layer ENL. In an embodiment, the sensor layer TP may include sensing electrodes that detect external inputs, and the sensing electrodes may include or be formed of transparent metal oxide or the like.

Figure 7:
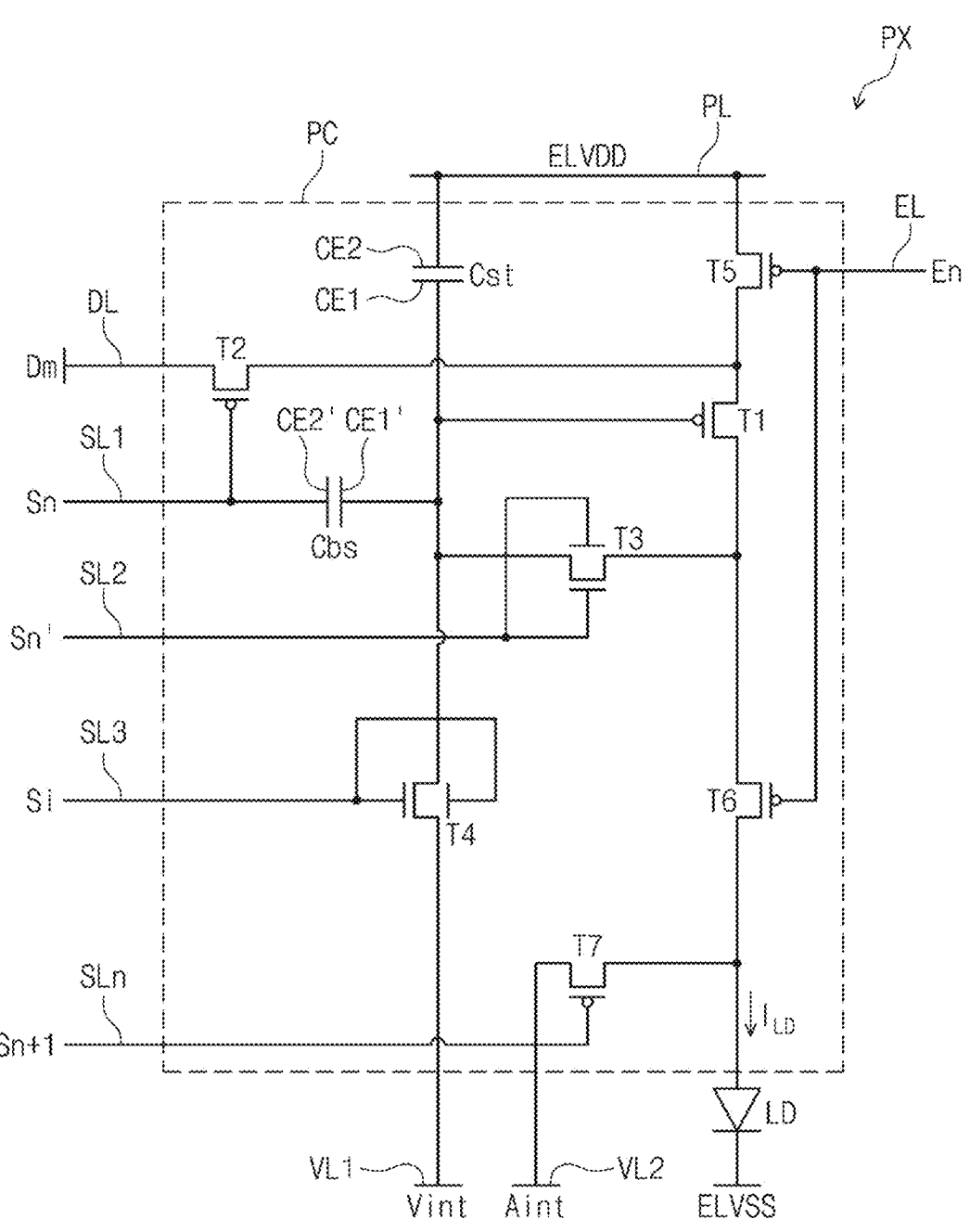
FIG. 7 is an equivalent circuit diagram of a pixel according to an embodiment of the invention.

FIG. 7 is an equivalent circuit diagram of a pixel according to an embodiment of the invention.

Referring to FIG. 7, an equivalent circuit diagram of an embodiment of one pixel PX among a plurality of pixels PX is shown. The pixel PX shown in FIG. 7 may be a first pixel PX1 (shown in FIG. 8), a second pixel PX2 (shown in FIG. 8), or a third pixel PX3 (shown in FIG. 8). The pixel PX may include a light emitting element LD and a pixel circuit PC. The light emitting element LD may be configured to be included in the light emitting element layer DP-ED of FIG. 5, and the pixel circuit PC may be configured to be included in the circuit layer DP-CL of FIG. 5.

The pixel circuit PC may include a plurality of thin film transistors T1, T2, T3, T4, T5, T6, and T7 and a storage capacitor Cst. The plurality of thin film transistors T1, T2, T3, T4, T5, T6, and T7 and the storage capacitor Cst may be electrically connected to signal lines SL1, SL2, SL3, SLn, EL, and DL, and a first initialization voltage line VL1, a second initialization voltage line VL2 (or an anode initialization voltage line), and a driving voltage line PL. In an embodiment, at least one of the above-described wirings, for example, the driving voltage line PL may be shared among neighboring pixels PX.

The plurality of thin film transistors T1, T2, T3, T4, T5, T6, and T7 may include a driving thin film transistor T1, a switching thin film transistor T2, a compensation thin film transistor T3, a first initialization thin film transistor T4, an operation control thin film transistor T5, a light emitting control thin film transistor T6, and a second initialization thin film transistor T7.

The light emitting element LD may include a lower electrode (e.g., an anode electrode or a pixel electrode) and an upper electrode (e.g., a cathode electrode or a common electrode), and the lower electrode of the light emitting element LD may be connected to the driving thin film transistor T1 via the light emitting control thin film transistor T6 to receive a driving current ILD, and the upper electrode may receive a low power voltage ELVSS. The light emitting element LD may generate light having a luminance corresponding to the driving current ILD.

Some of the plurality of thin film transistors T1, T2, T3, T4, T5, T6, and T7 may be provided as an n-channel transistor, e.g., an n-channel metal-oxide-semiconductor (NMOS) transistor or an n-channel field-effect transistor (n-MOSFET), and the others of the plurality of thin film transistors T1, T2, T3, T4, T5, T6, and T7 may be provided as an p-channel transistor, e.g., an p-channel metal-oxide-semiconductor (PMOS) transistor or an PMOS field-effect transistor (p-MOSFET). In an embodiment, for example, among the plurality of thin film transistors T1, T2, T3, T4, T5, T6, and T7, the compensation thin film transistor T3 and the first initialization thin film transistor T4 may be provided as n-MOSFET, and the others may be provided as a p-MOSFET.

In an alternative embodiment, among the plurality of thin film transistors T1, T2, T3, T4, T5, T6, and T7, the compensation thin film transistor T3, the first initialization thin film transistor T4, and the second initialization thin film transistor T7 may be provided as NMOS transistors, and the others may be provided as PMOS transistors. Alternatively, only one of the plurality of thin film transistors T1, T2, T3, T4, T5, T6, and T7 may be provided as NMOS transistors and the others may be provided as PMOS transistors. Alternatively, the plurality of thin film transistors T1, T2, T3, T4, T5, T6, and T7 may all be provided as NMOS transistors, or the plurality of thin film transistors may all be provided as PMOS transistors.

Signal lines may include a first scan line SL1 that delivers a first scan signal Sn, a second scan line SL2 that delivers a second scan signal Sn', a third scan line SL3 that delivers a third scan signal S1 to the first initialization thin film transistor T4, a light emitting control line EL that delivers a light emitting control signal En to the operation control thin film transistor T5 and the light emitting control thin film transistor T6, a next scan line SLn that delivers a next scan signal Sn+1 to the second initialization thin film transistor T7, and a data line DL that crosses the first scan line SL1 and delivers the data signal Dm. The first scan signal Sn may be a current scan signal, and the next scan signal Sn+1 may be a next scan signal of the first scan signal Sn.

The driving voltage line PL may deliver the driving voltage ELVDD to the driving thin film transistor T1, and the first initialization voltage line VL1 may deliver the driving thin film transistor T1 and an initialization voltage Vint that initializes a pixel electrode.

A driving gate electrode of the driving thin film transistor T1 may be connected to the storage capacitor Cst, a driving source region of the driving thin film transistor T1 may be connected to the driving voltage line PL via the operation control thin film transistor T5, and a driving drain region of the driving thin film transistor T1 may be electrically connected to a first electrode of the light emitting element LD via the light emitting control thin film transistor T6. The driving thin film transistor T1 may receive the data signal Dm based on the switching operation of the switching thin film transistor T2 to supply the driving current ILD to the light emitting element LD.

A switching gate electrode of the switching thin film transistor T2 may be connected to the first scan line SL1 that delivers the first scan signal Sn, a switching source region of the switching thin film transistor T2 may be connected to the data line DL, and a switching drain region of the switching thin film transistor T2 may be connected to the driving source region of the driving thin film transistor T1 and be connected to the driving voltage line PL via the operation control thin film transistor T5. The switching thin film transistor T2 may be turned on in response to the first scan signal Sn delivered through the first scan line SL1 to perform a switching operation of delivering the data signal Dm delivered through the data line DL to the driving source region of the driving thin film transistor T1.

A compensation gate electrode of the compensation thin film transistor T3 is connected to the second scan line SL2. A compensation drain region of the compensation thin film transistor T3 may be connected to the driving drain region of the driving thin film transistor T1, and may be connected to the pixel electrode of the light emitting element LD via the light emitting control thin film transistor T6. A compensation source region of the compensation thin film transistor T3 may be connected to the first electrode Cst1 of the storage capacitor Cst and the driving gate electrode of the driving thin film transistor T1. In addition, the compensation source region may be connected to the first initialization thin film transistor T4.

The compensation thin film transistor T3 may be turned on in response to the second scan signal Sn' delivered through the second scan line SL2 to electrically connect the driving gate electrode with the driving drain region of the driving thin film transistor T1, thereby diode-connecting the driving thin film transistor T1.

A first initialization gate electrode of the first initialization thin film transistor T4 may be connected to the third scan line SL3. A first initialization source region of the first initialization thin film transistor T4 may be connected to the second initialization source region of the second initialization thin film transistor T7 and the first initialization voltage line VL1. A first initialization drain region of the first initialization thin film transistor T4 may be connected to the first electrode Cst1 of the storage capacitor Cst, the compensation source region of the compensation thin film transistor T3, and the driving gate electrode of the driving thin film transistor T1. The first initialization thin film transistor T4 may be turned on in response to the third scan signal Si delivered through the third scan line SL3 to perform an initialization operation of delivering the initialization voltage Vint to the driving gate electrode of the driving thin film transistor T1 to initialize the voltage of the driving gate electrode of the driving thin film transistor T1.

An operation control gate electrode of the operation control thin film transistor T5 may be connected to the light emitting control line EL, an operation control source region of the operation control thin film transistor T5 may be connected to the driving voltage line PL, an operation control drain region of the operation control thin film transistor T5 may be connected to the driving source region of the driving thin film transistor T1 and the switching drain region of the switching thin film transistor T2.

A light emitting control gate electrode of the light emitting control thin film transistor T6 may be connected to the light emitting control line EL, a light emitting control source region of the light emitting control thin film transistor T6 may be connected to the driving drain region of the driving thin film transistor T1 and the compensation drain region of the compensation thin film transistor T3, a light emitting control drain region of the light emitting control thin film transistor T6 may be electrically connected to the second initialization drain region of the second initialization thin film transistor T7 and the pixel electrode of the light emitting element LD.

The operation control thin film transistor T5 and the light emitting control thin film transistor T6 are turned on together in response to the light emitting control signal En delivered through the light emitting control line EL to deliver the driving voltage ELVDD to the light emitting element LD, thereby allowing the driving current ILD to flow through the light emitting element LD.

A second initialization gate electrode of the second initialization thin film transistor T7 may be connected to the next scan line SLn, a second initialization drain region of the second initialization thin film transistor T7 may be connected to the light emitting control drain region of the light emitting control thin film transistor T6 and the pixel electrode of the light emitting element LD, and a second initialization source region of the second initialization thin film transistor T7 may be connected to the second initialization voltage line VL2 to receive an anode initialization voltage Aint. The second initialization thin film transistor T7 is delivered through the scan line SLn, and then turned on in response to the scan signal Sn+1 to initialize the pixel electrode of the light emitting element LD.

In an alternative embodiment, the second initialization thin film transistor T7 may be connected to the light emitting control line EL and be driven based on the light emitting control signal En. In such an embodiment, positions of the source regions and the drain regions may be changed based on transistor type (p-type or n-type).

The storage capacitor Cst may include a first electrode Cst1 and a second electrode Cst2. The first electrode Cst1 of the storage capacitor Cst is connected to the driving gate electrode of the driving thin film transistor T1, and the second electrode Cst2 of the storage capacitor Cst is connected to the driving voltage line PL. The storage capacitor Cst may store charges a voltage corresponding to a difference between the driving gate electrode voltage and the driving voltage ELVDD of the driving thin film transistor T1.

A boosting capacitor Cbs may include a first electrode CE1' and a second electrode CE2'. The first electrode CE1' of the boosting capacitor Cbs may be connected to the first electrode Cst1 of the storage capacitor Cst, and the second electrode CE2' of the boosting capacitor Cbs may be provided with the first scan signal Sn. The boosting capacitor Cbs may increase the voltage of a gate terminal of the driving thin film transistor T1 at a point where the first scan signal Sn is stopped being provided to compensate for voltage drop of the gate terminal.

A detailed operation of each pixel PX according to an embodiment is as follows.

During an initialization period, when the third scan signal Si is supplied through the third scan line SL3, the first initialization thin film transistor T4 is turned on in response to the third scan signal Si, and the driving thin film transistor T1 is initialized by the initialization voltage Vint supplied from the first initialization voltage line VL1.

During a data programming period, when the first scan signal Sn and the second scan signal Sn' are supplied through the first scan line SL1 and the second scan line SL2, the switching thin film transistor T2 and the compensation thin film transistor T3 are turned on in response to the first scan signal Sn and the second scan signal Sn'. At this point, the driving thin film transistor T1 is diode-connected by the turned-on compensation thin film transistor T3 and is biased in a forward direction.

Then, in the data signal Dm supplied from the data line DL, a compensation voltage (Dm+Vth, where Vth has a negative value) reduced by a threshold voltage (Vth) of the driving thin film transistor T1 is applied to the driving gate electrode of the driving thin film transistor T1.

The driving voltage ELVDD and the compensation voltage (Dm+Vth) are applied to both ends of the storage capacitor Cst, and charges corresponding to a voltage difference between both ends are stored in the storage capacitor Cst.

During a light emitting period, the operation control thin film transistor T5 and the light emitting control thin film transistor T6 are turned on by the light emitting control signal En supplied from the light emitting control line EL. The driving current ILD is generated based on a voltage difference between the voltage of the driving gate electrode and the driving voltage ELVDD of the driving thin film transistor T1, and the driving current ILD is supplied to the light emitting element LD through the light emitting control thin film transistor T6.

In an embodiment, at least one of the plurality of thin film transistors T1, T2, T3, T4, T5, T6, and T7 includes a semiconductor layer including oxide, and the others include a semiconductor layer including silicon.

In such an embodiment, the driving thin film transistor T1 that directly affects the brightness of a display device is configured to include a semiconductor layer formed of polycrystalline silicon having high reliability, and accordingly, a high-resolution display device may be obtained.

In an embodiment, the oxide semiconductor has high carrier mobility and low leakage current, and accordingly does not have a big voltage drop even with long driving time. That is, the color change of images due to the voltage drop is not drastic even upon low-frequency driving, and thus low-frequency driving is allowed.

As described above, the oxide semiconductor has a desired characteristic of low leakage current, and at least one of the compensation thin film transistor T3 connected to the driving gate electrode of the driving thin film transistor T1, the first initialization thin film transistor T4, or the second initialization thin film transistor T7 may thus be employed as an oxide semiconductor to prevent leakage current that may flow to the driving gate electrode and to reduce power consumption as well.

Figure 8:
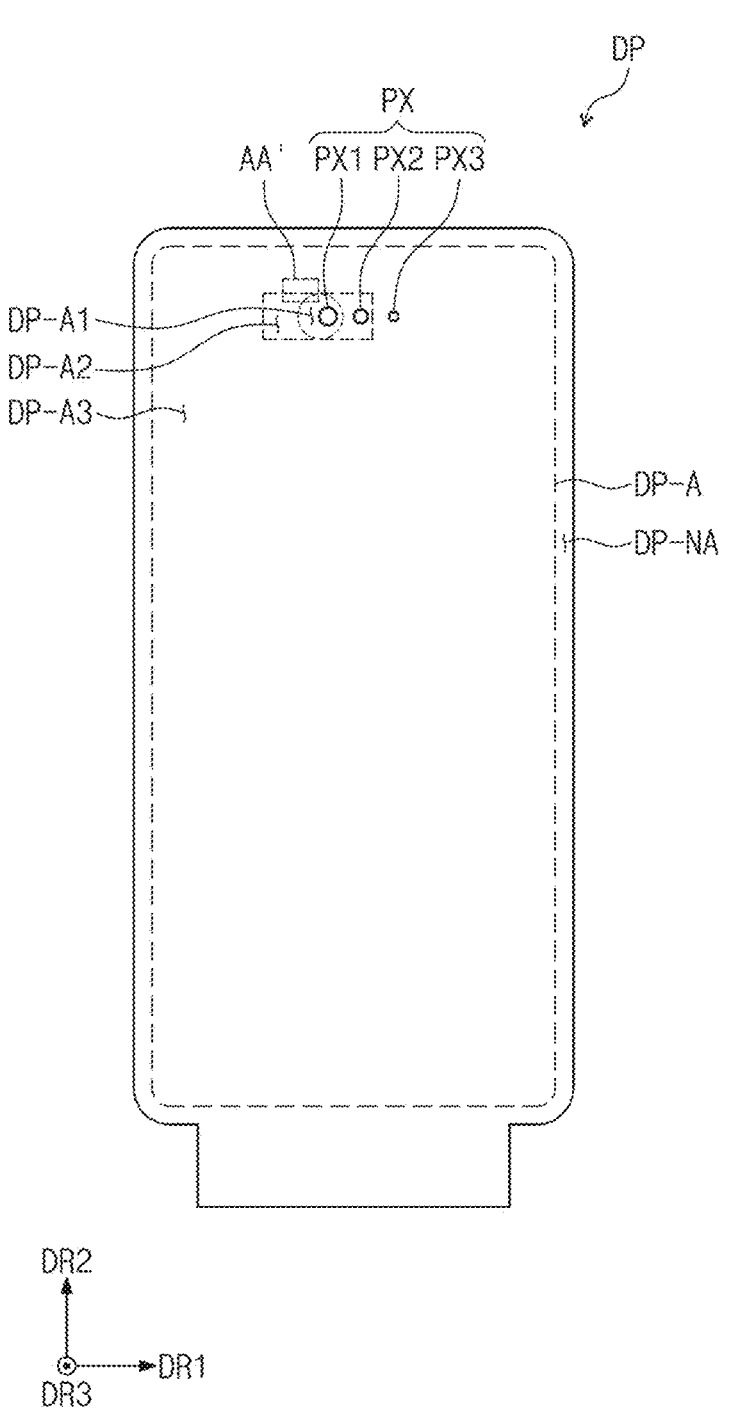
FIG. 8 is a plan view of a display panel according to an embodiment of the invention.
Figure 9:
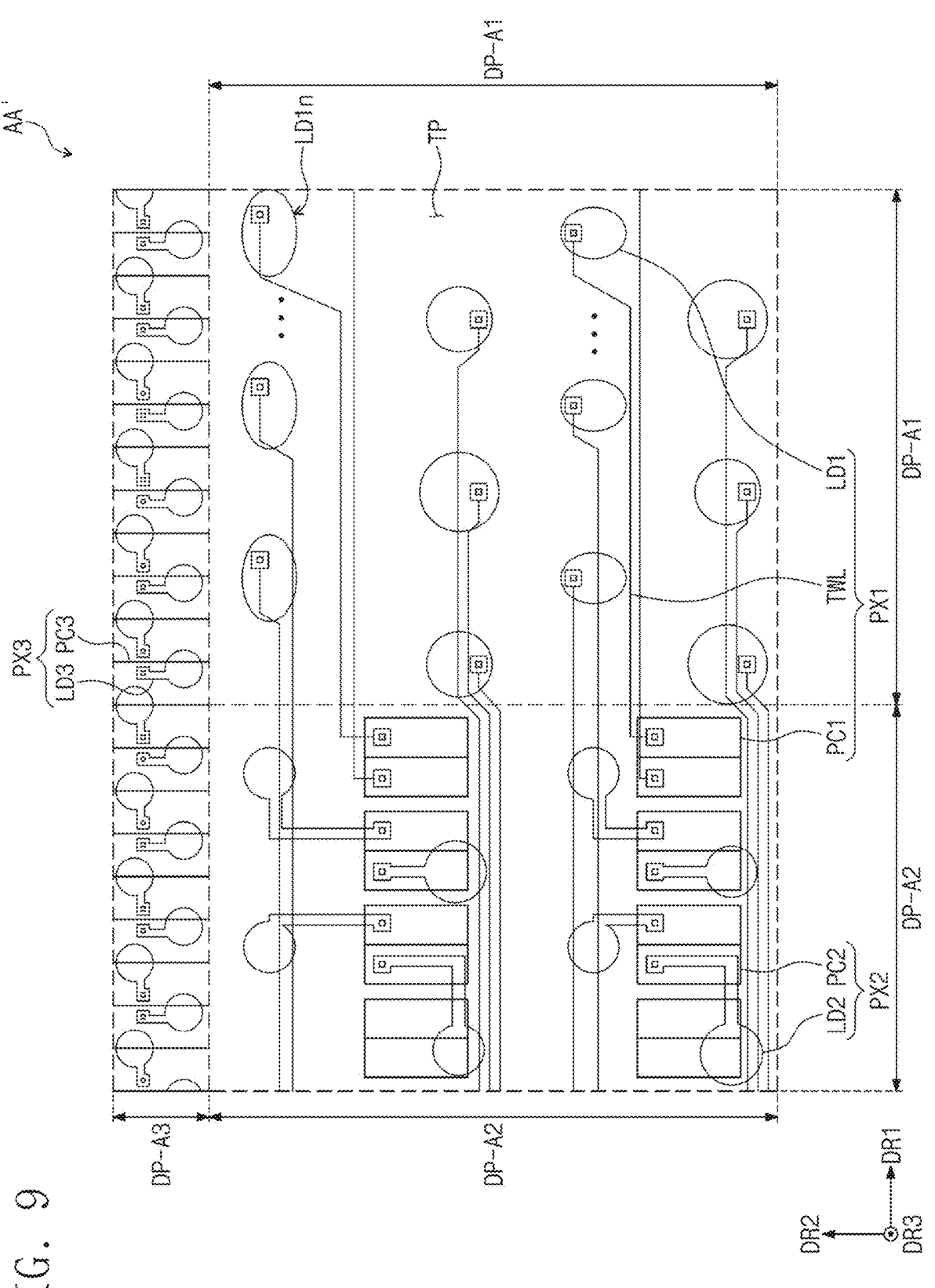
FIG. 9 is a plan view enlarging a portion of a display panel according to an embodiment of the invention.

FIG. 8 is a plan view of a display panel according to an embodiment of the invention. FIG. 9 is a plan view enlarging a portion of a display device according to an embodiment of the invention. FIG. 9 is a plan view enlarging region AA' of FIG. 8.

Referring to FIGS. 8 and 9, an embodiment of the display panel DP may include a display region DP-A and a non-display region DP-NA. The non-display region DP-NA may be adjacent to the display region DP-A and may surround at least a portion of the display region DP-A.

The display region DP-A may include a first region DP-A1, a second region DP-A2, and a third region DP-A3. The first region DP-A1 may be referred to as a component region, the second region DP-A2 may be referred to as a middle region or a transition region, and the third region DP-A3 may be referred to as a main display region or a general display region. The first region DP-A1 and the second region DP-A2 may be collectively referred to as an auxiliary display region.

The display panel DP may include a plurality of pixels PX. The display panel DP may include a first pixel PX1 that emits light in the first region DP-A1, a second pixel PX2 that emits light in the second region DP-A2, and a third pixel PX3 that emits light in in the second region DP-A2 and the third region DP-A3.

Each of the first pixel PX1, the second pixel PX2, and the third pixel PX3 may be provided in plurality. In an embodiment, each of the first to third pixels PX1, PX2, and PX3 may include a red pixel, a green pixel, and a blue pixel, and may further include a white pixel according to an embodiment.

The first pixel PX1 may include a first light emitting element LD1 and a first pixel circuit PC1 that drives the first light emitting element LD1, the second pixel PX2 may include a second light emitting element LD2 and a second pixel circuit PC2 that drives the second light emitting element LD2, and the third pixel PX3 may include a third light emitting element LD3 and a third pixel circuit PC3 that drives the third light emitting element LD3. The positions of the first pixel PX1, the second pixel PX2, and the third pixel PX3 in FIG. 8 are shown to correspond to the positions of the first, second, and third light emitting elements LD1, LD2, and LD3 shown in FIG. 9.

The first region DP-A1 may overlap or correspond to the sensing region SA-ED of the electronic device ED described above with reference to FIG. 4. That is, the first region DP-A1 may be provided in a region overlapping the electronic module EM shown in FIG. 4 when viewed on a plane. In an embodiment, for example, an external input (e.g., light) may be provided to the electronic module EM through the first region DP-A1, and an output from the electronic module EM may be emitted to the outside through the first region DP-A1. Although the first region DP-A1 herein is shown to have a circular shape, the first region DP-A1 may have various shapes such as a polygon, an ellipse, a figure having at least one curved side, or an irregular shape, and is not limited to any one embodiment.

In an embodiment, fewer pixels may be provided in the first region DP-A1 than in the third region DP-A3 to secure an area of a transmission region. In the first region DP-A1, a region in which the first light emitting element LD1 is not disposed may be defined as a transmission region TA (see FIG. 12). In an embodiment, for example, in the first region DP-A1, a region in which the first electrode of the first light emitting element LD1 and pixel defining patterns surrounding the first electrode are not disposed is defined as a transmission region TA (see FIG. 12).

The number of first pixels PX1 disposed in the first region DP-A1 per unit area or in the same size of area may be less than the number of third pixels PX3 disposed in the third region DP-A3. That is, a pixel density in the first region DP-A1 than a pixel density in the third region DP-A3. In an embodiment, for example, the resolution of the first region DP-A1 is about ½, ⅜, ⅓, ¼, ⅖, ⅛, ⅑, or ¹⁄₁₆ of the resolution of the third region DP-A3. In an embodiment, for example, the resolution of the third region DP-A3 may be about 400 pixels per inch (ppi) or greater, and the resolution of the first region DP-A1 may be in a range of about 200 ppi or about 100 ppi. However, this is merely an example, and the embodiment of the invention is not limited thereto.

The first pixel circuit PC1 of the first pixel PX1 may not be disposed in the first region DP-A1. In an embodiment, for example, the first pixel circuit PC1 may be disposed in the second region DP-A2 or the non-display region DP-NA. In such an embodiment, the light transmittance of the first region DP-A1 may be increased compared to when the first pixel circuit PC1 is disposed in the first region DP-A1.

The first light emitting element LD1 and the first pixel circuit PC1 may be electrically connected through a wiring layer TWL. The wiring layer TWL may overlap a transmission region of the first region DP-A1. The wiring layer TWL may include a metal material or a conductive polymer material. The wiring layer TWL may include a light-transmitting material.

The second region DP-A2 is adjacent to the first region DP-A1. The second region DP-A2 may surround at least a portion of the first region DP-A1. The second region DP-A2 may be a portion having a transmittance lower than that of the first region DP-A1. In an embodiment, the second region DP-A2 may be spaced apart from the non-display region DP-NA. However, the embodiment of the invention is not limited thereto, and the second region DP-A2 may be in contact with the non-display region DP-NA.

The first pixel circuit PC1 of the first pixel PX1, a second light emitting element LD2, and a second pixel circuit PC2 may be disposed in the second region DP-A2. Accordingly, the light transmittance of the second region DP-A2 may be lower than that of the first region DP-A1. In addition, as the first pixel circuit PC1 of the first pixel PX1 is disposed in the second region DP-A2, the number of second pixels PX2 disposed in the second region DP-A2 per unit area or in the same size of area may be less than the number of third pixels PX3 disposed in the third region DP-A3. The resolution of images displayed on the second region DP-A2 may be lower than the resolution of images displayed on the third region DP-A3.

The third region DP-A3 is adjacent to the second region DP-A2. The third region DP-A3 may be adjacent to the first region DP-A1. The third region DP-A3 may be defined as a portion having a transmittance lower than that of the first region DP-A1. A third light emitting element LD3 and a third pixel circuit PC3 may be disposed in the second region DP-A2.

In an embodiment, a first light emitting element LD1$n$ disposed in the first region DP-A1 placed closest to the third region DP-A3 may have a circular shape having a greater width in a specific direction to secure the distance from the third light emitting element LD3 disposed in the third region DP-A3. In an embodiment, for example, where the first region DP-A1 is adjacent to the third region DP-A3 in the second direction DR2, the width of the first light emitting element LD1$n$ in the first direction DR1 may be greater than the width in the two directions DR2.

Each of the first light emitting element LD1, the second light emitting element LD2, and the third light emitting element LD3 may be provided in plurality. The distance between two first light emitting elements placed closest among the first light emitting elements LD1 may be greater than the distance between two third light emitting elements placed closest among the third light emitting elements LD3. In addition, the distance between two second light emitting elements placed closest among the second light emitting elements LD2 may be greater than the distance between two light emitting elements placed closest among the third light emitting elements LD3.

Figure 10:
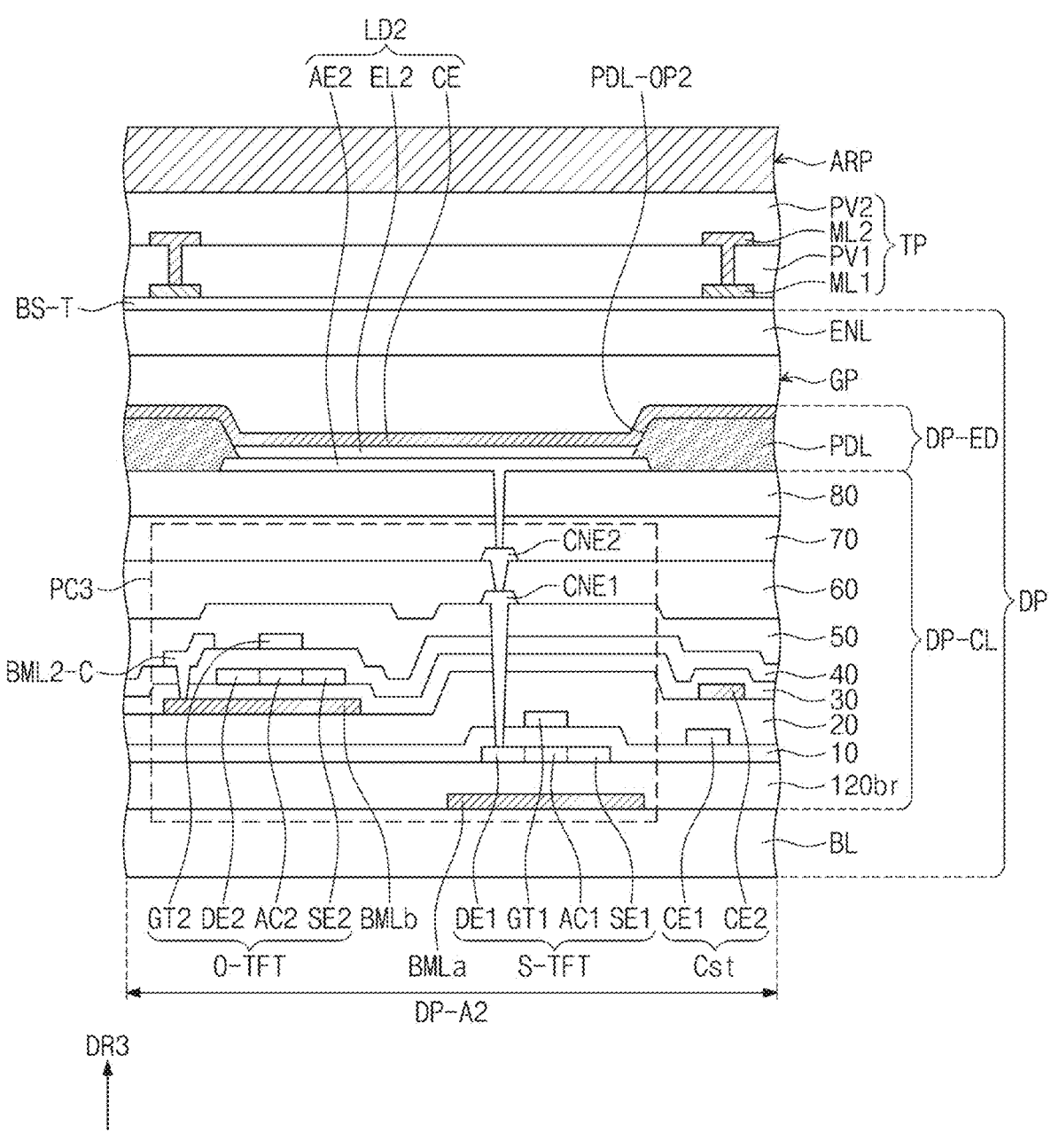
FIGS. 10 and 11 are each a cross-sectional view of a display device according to an embodiment of the invention.

The first, second, and third light emitting elements LD1, LD2, and LD3 shown in FIG. 9 may correspond to a shape on a plane (or a planar shape) of a first lower electrode AE1 (see FIG. 11) of the first light emitting element LD1, a second lower electrode AE2 of the second light emitting element LD2 (see FIG. 11), and a third lower electrode AE3 of the third light emitting element LD3 (see FIG. 10). As shown in FIG. 9, a planar area of the first lower electrode AE1 (see FIG. 11) may be greater than a planar area of the third lower electrode AE3 (see FIG. 10).

Figure 11:
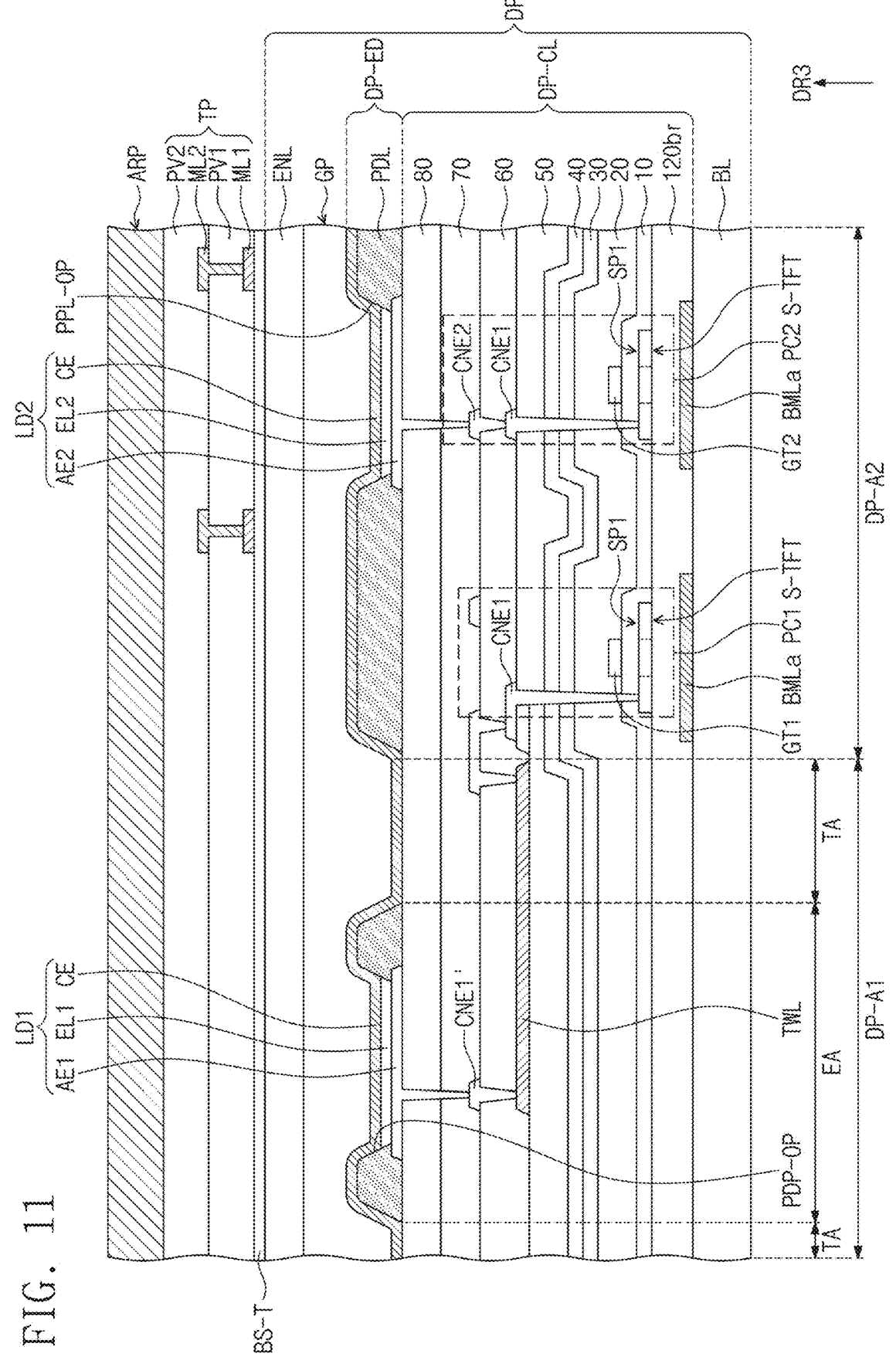

FIGS. 10 and 11 are cross-sectional views of a display device according to an embodiment of the invention; FIG. 10 is a cross-sectional view of a portion including the third region DP-A3, and FIG. 11 is a cross-sectional view of a portion including the first region DP-A1 and the second region DP-A2.

Referring to FIGS. 10 and 11, an embodiment of the display panel DP may include a plurality of insulating layers, semiconductor patterns, conductive patterns, signal lines, and the like. In an embodiment, an insulating layer, a semiconductor layer, and a conductive layer may be formed by a method of coating, deposition, or the like. Thereafter, the insulating layer, the semiconductor layer, and the conductive layer may be selectively patterned through a photolithography method. The semiconductor patterns, the conductive patterns, the signal lines, and the like included in the circuit layer DP-CL and the light emitting element layer DP-ED may be formed through such processes described above. Subsequently, an encapsulation layer ENL that covers the light emitting element layer DP-ED may be formed.

FIG. 10 shows a silicon transistor S-TFT and an oxide transistor O-TFT of the third light emitting element LD3 and the third pixel circuit PC3. FIG. 11 shows the first light emitting element LD1 and the first pixel circuit PC1, the second light emitting element LD2 and the second pixel circuit PC2.

A buffer layer 120br may be disposed on the base layer BL. The buffer layer 120br may prevent metal atoms or impurities from diffusing into a first semiconductor pattern from the base layer BL. In addition, the buffer layer 120br may control a heat supply rate upon a crystallization process for forming the first semiconductor pattern to allow the first semiconductor pattern to be uniformly formed.

A first rear metal layer BMLa may be disposed below the silicon transistor S-TFT, and a second rear metal layer BMLb may be disposed below the oxide transistor O-TFT. The first and second rear metal layers BMLa and BMLb may be disposed to overlap the first to third pixel circuits PC1, PC2, and PC3. The first and second rear metal layers BMLa and BMLb may block external light from reaching the first to third pixel circuits PC1, PC2, and PC3. In addition, the first and second rear metal layers BMLa and BMLb may block a laser or the like for etching from reaching the first to third pixel circuits PC1, PC2, and PC3 in a subsequent process. The first and second rear metal layers BMLa and BMLb may not overlap the first region DP-A1.

The first rear metal layer BMLa may be disposed between the base layer BL and the buffer layer 120br. In an embodiment of the invention, an inorganic barrier layer may be further disposed between the first rear metal layer BMLa and the buffer layer 120br. The first rear metal layer BMLa may be connected to an electrode or a wiring and may receive a constant voltage or a signal therefrom. According to an embodiment of the invention, the first rear metal layer BMLa may be a floating electrode isolated or electrically insulated from other electrodes or wirings.

The second rear metal layer BMLb may be disposed to correspond to a lower portion of the oxide transistor O-TFT. The second rear metal layer BMLb may be disposed between a second insulating layer 20 and a third insulating layer 30. The second rear metal layer BMLb may be disposed on the same layer as the second electrode CE2 of the storage capacitor Cst. The second rear metal layer BMLb may be connected to a contact electrode BML2-C to receive a constant voltage or a signal. The contact electrode BML2-C may be disposed in or directly on a same layer as a gate GT2 of the oxide transistor O-TFT.

The first rear metal layer BMLa and the second rear metal layer BMLb may each include a reflective metal. In an embodiment, for example, the first rear metal layer BMLa and the second rear metal layer BMLb may each include at least one selected from silver (Ag), silver-containing alloy, molybdenum (Mo), molybdenum-containing alloy, aluminum (Al), aluminum-containing alloy, aluminum nitride (AlN), tungsten (W), tungsten nitride (WN), copper (Cu), and p+ doped amorphous silicon. The first rear metal layer BMLa and the second rear metal layer BMLb may include a same material as or different materials from each other.

Although not shown separately, according to an embodiment of the invention, the second rear metal layer BMLb may be omitted. The first rear metal layer BMLa may extend to a lower portion of the oxide transistor O-TFT, and the first rear metal layer BMLa may thus block light incident to the lower portion of the oxide transistor O-TFT.

The first semiconductor pattern SP1 may be disposed on the buffer layer 120br. The first semiconductor pattern may include a silicon semiconductor. In an embodiment, for example, the silicon semiconductor may include amorphous silicon, polycrystalline silicon, or the like. In an embodiment, for example, the first semiconductor pattern may include low-temperature polysilicon.

FIGS. 10 and 11 show only a portion of the first semiconductor pattern SP1 disposed on the buffer layer 120br, and the first semiconductor pattern SP1 may be further disposed in another region. The first semiconductor pattern SP1 may be arranged in a specific rule or pattern across the pixels. The first semiconductor pattern SP1 may have different electrical properties based on whether being doped or not. The first semiconductor pattern SP1 may include a first region having high conductivity and a second region having low conductivity. The first region may be doped with an N-type dopant or a P-type dopant. A P-type transistor may include a doped region doped with the P-type dopant, and a N-type transistor may include a doped region doped with the N-type dopant. The second region may be a non-doped region or may be doped in a lower concentration than the first region.

The first region has greater conductivity than the second region, and may substantially serve as an electrode or a signal line. The second region may substantially correspond to an active region (or a channel) of the transistor. That is, a portion of the semiconductor pattern may be an active region of the transistor, another portion may be a source or drain of the transistor, and the other portion may be a connection electrode or a connection signal line.

A source region SE1 (or a source), an active region AC1 (or a channel), and a drain region DE1 (or a drain) of the silicon transistor S-TFT may be formed from (or defined by) a portion of the first semiconductor pattern SP1. The source region SE1 and the drain region DE1 may extend in opposite directions from the active region AC1 on a cross section.

A first insulating layer 10 may be disposed on the buffer layer 120br. A first insulating layer 10 may commonly overlap a plurality of pixels and cover the first semiconductor pattern. The first insulating layer 10 may be an inorganic layer and/or an organic layer, and have a single-layered or multi-layered structure. The first insulating layer 10 may include at least one selected from aluminum oxide, titanium oxide, silicon oxide, silicon nitride, silicon oxynitride, zirconium oxide, and hafnium oxide. In the embodiment, the first insulating layer 10 may be a single-layered silicon oxide layer. Insulating layers of the circuit layer DP-CL which will be described later in addition to the first insulating layer 10 may be inorganic layers and/or organic layers, and have single-layered or multi-layered structures. The inorganic layer may include at least one selected from the materials described above, but is not limited thereto.

The gate GT1 of the silicon transistor S-TFT is disposed on the first insulating layer 10. The gate GT1 may be a portion of a metal pattern. The gate GT1 overlaps the active region AC1. In the process of doping the first semiconductor pattern SP1, the gate GT1 may function as a mask. The gates GT1 may include at least one selected from titanium (Ti), silver (Ag), silver-containing alloy, molybdenum (Mo), molybdenum-containing alloy, aluminum (Al), aluminum-containing alloy, aluminum nitride (AlN), tungsten (W), tungsten nitride (WN), copper (Cu), indium tin oxide (ITO), indium zinc oxide (IZO), and the like.

A second insulating layer 20 may be disposed on the first insulating layer 10 and may cover the gate GT1. The second insulating layer 20 may be an inorganic layer and/or an organic layer, and may have a single-layered or multi-layered structure. The second insulating layer 20 may include at least one selected from silicon oxide, silicon nitride, and silicon oxynitride. In an embodiment, the second insulating layer 20 may have a multi-layered structure including a silicon oxide layer and a silicon nitride layer.

A third insulating layer 30 may be disposed on the second insulating layer 20. The third insulating layer 30 may have a single-layered or multi-layered structure. In an embodiment, for example, the third insulating layer 30 may have a multi-layered structure including a silicon oxide layer and a silicon nitride layer. The second electrode CE2 of the storage capacitor Cst may be disposed between the second insulating layer 20 and the third insulating layer 30. In addition, the first electrode CE1 of the storage capacitor Cst may be disposed between the first insulating layer 10 and the second insulating layer 20.

A second semiconductor pattern SP2 may be disposed on the third insulating layer 30. The second semiconductor pattern SP2 may include an oxide semiconductor. The second semiconductor pattern SP2 may include an oxide semiconductor. The second semiconductor pattern SP2 may include a transparent conductive oxide such as indium tin oxide (ITO), indium zinc oxide (IZO), indium gallium zinc oxide (IGZO), zinc oxide (ZnO), or indium oxide ($In_2O_3$).

The oxide semiconductor may include a plurality of regions divided according to whether transparent conductive oxides are reduced. A region in which the transparent conductive oxide is reduced (hereinafter, reduction region) has greater conductivity than a region in which the transparent conductive oxide is not reduced (hereinafter, non-reduction region). The reduction region substantially serves as a source/drain or signal line of transistors. The non-reduction region substantially corresponds to a semiconductor region (or active region or channel) of transistors. In such an embodiment, a portion of the second semiconductor pattern SP2 may be a semiconductor region of transistors, another partial region may be a source region/drain region of transistors, and the other region may be a signal transmission region.

The source region SE2, the active region AC2, and the drain region DE2 of the oxide transistor O-TFT may be formed from the second semiconductor pattern SP2. The source region SE2 and the drain region DE2 may extend in opposite directions from the active region AC2 on a cross section.

A fourth insulating layer 40 may be disposed on the third insulating layer 30. The fourth insulating layer 40 may commonly overlap a plurality of pixels and cover the second semiconductor pattern SP2. The fourth insulating layer 40 may include at least one selected from aluminum oxide, titanium oxide, silicon oxide, silicon nitride, silicon oxynitride, zirconium oxide, and hafnium oxide. Alternatively, unlike what is shown, the fourth insulating layer 40 may be an insulation pattern overlapping the gate GT2 of the oxide transistor O-TFT and be exposed by the source region SE2 and the drain region DE2 of the oxide transistor O-TFT.

The gate GT2 of the oxide transistor O-TFT is disposed on the fourth insulating layer 40. The gate GT2 may be a portion of a metal pattern. The gate GT2 overlaps the active region AC2. In the process of doping the second semiconductor pattern SP2, the gate GT2 may function as a mask.

A fifth insulating layer 50 may be disposed on the fourth insulating layer 40 and may cover the gate GT2. The fifth insulating layer 50 may be an inorganic layer and/or an organic layer, and have a single-layered or multi-layered structure.

A first connection electrode CNE1 may be disposed on the fifth insulating layer 50. The first connection electrode CNE1 may be connected to drain region DE1 of the silicon transistor S-TFT through a contact hole defined through the first to fifth insulating layers 10, 20, 30, 40, and 50.

A sixth insulating layer 60 may be disposed on the fifth insulating layer 50. A second connection electrode CNE2 may be disposed on the sixth insulating layer 60. The second electrode CNE2 may be connected to the first connection electrode CNE1 through a contact hole defined through the sixth insulating layer 60. A seventh insulating layer 70 may be disposed on the sixth insulating layer 60 and may cover the second connection electrode CNE2. An eighth insulating layer 80 may be disposed on the seventh insulating layer 70.

The sixth insulating layer 60, the seventh insulating layer 70, and the eighth insulating layer 80 each may be an organic layer. In an embodiment, for example, the sixth insulating layer 60, the seventh insulating layer 70, and the eighth insulating layer 80 each may include at least one selected from benzocyclobutene (BCB), polyimide, hexamethyldisiloxane (HMDSO), general polymers such as polymethylmethacrylate (PMMA) or polystyrene (PS), a polymer derivative having a phenolic group, an acrylic polymer, an imide-based polymer, an aryl ether polymer, an amide-based polymer, a fluorine-based polymer, a p-xylene-based polymer, a vinyl alcohol polymer, and a blend thereof.

The light emitting element layer DP-ED including the first to third light emitting elements LD1, LD2, and LD3 may be disposed on the circuit layer DP-CL. The first light emitting element LD1 may include a first electrode AE1, a first emission layer EL1, and a second electrode CE (or a common electrode), the second light emitting element LD2 may include a first electrode AE2, a second emission layer EL2, and a second electrode CE, and the third light emitting element LD3 may include a first electrode AE3, a third emission layer EL3, and a second electrode CE. The second electrode CE of the first light emitting element LD1 and the second light emitting element LD2 may be in the form of a single body with the second electrode CE of the third light emitting element LD3. That is, the second electrode CE may be provided in common to the first light emitting element LD1, the second light emitting element LD2, and the third light emitting element LD3.

The first electrodes AE1, AE2, and AE3 may be disposed on the eighth insulating layer 80. The first electrodes AE1, AE2, and AE3 may be a transflective electrode or a reflective electrode. In an embodiment, the first electrodes AE1, AE2, and AE3 may be provided with (formed from or defined by portions of) a reflective layer including or formed of Ag, Mg, A1, Pt, Pd, Au, Ni, Nd, Ir, Cr, or a compound thereof, and a transparent or semi-transparent electrode layer formed on the reflective layer The transparent or semi-transparent electrode may include at least one selected from indium tin oxide (ITO), indium zinc oxide (IZO), indium gallium zinc oxide (IGZO), zinc oxide (ZnO), indium oxide ($In_2O_3$), and aluminum-doped zinc oxide (AZO). In an embodiment, for example, the first electrodes AE1, AE2, and AE3 may include a three-layered structure of ITO/Ag/ITO.

A pixel defining film PDL and a pixel defining pattern PDP may be disposed on the eighth insulating layer 80. The pixel defining film PDL and the pixel defining pattern PDP may include a same material as each other and may be formed through a same process as each other. Each of the pixel defining film PDL and the pixel defining pattern PDP may have a property of absorbing light. In an embodiment, for example, each of the pixel defining film PDL and the pixel defining pattern PDP may include a black coloring agent. The black component may include a black dye and a black pigment, and may include, for example, carbon black, a metal such as chromium, or an oxide thereof.

The pixel defining pattern PDP may be disposed in the first region DP-A1. The pixel defining pattern PDP may cover a portion of the first electrode AE1. For example, the pixel defining pattern PDP may cover an edge of the first electrode AE1. The pixel defining pattern PDP may have a ring shape when viewed in the thickness direction of the display panel DP, for example, in the third direction DR3. However, the embodiment of the invention is not limited thereto, and alternatively, the pixel defining pattern PDP may have, for example, a rhombus shape or a rectangular shape when viewed in the third direction DR3.

The pixel defining film PDL may be disposed in the second region DP-A2 and the third region DP-A3. The pixel defining film PDL may cover a portion of each of the first electrode AE2 and the first electrode AE3. In an embodiment, for example, a first opening PDL-OP1 exposing a portion of the first electrode AE2 and a second opening PDL-OP2 exposing a portion of the first electrode AE3 may be defined in the pixel defining film PDL.

The pixel defining pattern PDP may increase the distance between the edge of the first electrode AE1 and the pixel defining film PDL may increase the distance between an edge of each of the first electrodes AE2 and AE3 and the second electrode CE. Accordingly, the pixel defining pattern PDP and the pixel defining film PDL may serve to prevent an arc from being caused at the edges of each of the first, second, and third lower electrodes AE1, AE2, and AE3.

In the first region DP-A1, a region overlapping the portion where the first electrode AE1 and the pixel defining pattern PDP are disposed may be defined as an element region EA, and the remaining region may be defined as a transmission region TA.

The first electrode AE1 may be electrically connected to the first pixel circuit PC1 disposed in the second region DP-A2. In an embodiment, for example, the first electrode AE1 may be electrically connected to the silicon transistor S-TFT through the connection electrodes CNE1' and CNE1, a connection bridge CPN, and the wiring layer TWL. In such an embodiment, the wiring layer TWL may overlap the transmission region TA. Accordingly, the wiring layer TWL may include a light-transmitting material.

The wiring layer TWL may electrically connect the first electrode AE1 with the first pixel circuit PC1. The wiring layer TWL may include a light-transmitting material. The wiring layer TWL may include a metal material or a conductive polymer material. The wiring layer TWL may include a light-transmitting material and thus have high light transmittance. In an embodiment, the wiring layer TWL may have a light transmittance of about 85% or greater in a visible light wavelength range.

The wiring layer TWL may be disposed between the fifth insulating layer 50 and the sixth insulating layer 60, but is not particularly limited thereto. The wiring layer TWL may be disposed, for example, between the fourth insulating layer 40 and the fifth insulating layer 50. The sixth insulating layer 60 may cover the wiring layer TWL. The connection bridge CPN may be disposed between the sixth insulating layer 60 and the seventh insulating layer 70.

The wiring layer TWL may be connected to the first pixel circuit PC1 through the connection bridge CPN and the connection electrode CNE1. Alternatively, the connection bridge CPN or the connection electrode CNE1 may be omitted. In an embodiment, the connection bridge CPN may be omitted, and the wiring layer TWL may be directly connected to the connection electrode CNE1. In such an embodiment, the wiring layer TWL may be electrically connected to the silicon transistor S-TFT by the connection electrode CNE1. The wiring layer TWL may be connected to the first electrode AE1 through the connection electrode CNE1'. In an embodiment, the connection electrode CNE1' may be omitted, and the wiring layer TWL may be directly connected to the first electrode AE1.

The wiring layer TWL may overlap the first region DP-A1 and partially overlap the second region DP-A2. The wiring layer TWL may not overlap the third region DP-A3 (see FIG. 10).

The first emission layer EL1 may be disposed on the first electrode AE1, the second emission layer EL2 may be disposed on the first electrode AE2, and the third emission layer EL3 may be disposed on the first electrode AE3. In an embodiment, each of the first to third emission layers EL1, EL2, and EL3 may emit light of blue, red, or green.

The second electrode CE may be disposed on an upper portion of each of the first to third emission layers EL1, EL2, and EL3. The second electrode CE may be commonly disposed in the plurality of pixels PX (see FIG. 8). The second electrode CE may be commonly disposed on the plurality of first pixels PX1, the plurality of second pixels PX2, and the plurality of third pixels PX3. The second electrode CE may be commonly formed on each of the plurality of first pixels PX1, the plurality of second pixels PX2, and the plurality of third pixels PX3, using an open mask.

The second electrode CE may be a light-transmitting electrode. In an embodiment, the second electrode CE may be a transparent or semi-transparent electrode, and may include or be formed of a metal thin film having a small work function, which includes Li, Ca, LiF/Ca, LiF/Al, Al, Ag, Mg, and a compound thereof. In addition, a transparent conductive oxide (TCO) layer such as ITO, IZO, ZnO, or $In_2O_3$ may be further disposed on the metal thin film.

Although not shown, a capping layer including an organic material may be formed on the second electrode CE. The capping layer may be a layer provided to both protect the second electrode CE and increase light extraction efficiency. The capping layer may include an organic material having a refractive index higher than that of the second electrode CE. Alternatively, the capping layer may be provided in a multilayer structure in which layers having different refractive indices from each other are stacked one on another. In an embodiment, for example, the capping layer may be provided in the stack form of a high refractive index layer/low refractive index layer/high refractive index layer. In such an embodiment, the high refractive index layer may have a refractive index of about 1.7 or greater, and the low refractive index layer may have a refractive index of about 1.3 or less. The capping layer may additionally include LiF. Alternatively, the capping layer may additionally include an inorganic insulating material such as silicon oxide ($SiO_2$) or silicon nitride ($SiN_x$).

Although not shown, a hole control layer may be disposed between the first electrodes AE1, AE2, and AE3 and the first to third emission layers EL1, EL2, and EL3. The hole control layer may include a hole transport layer, and may further include a hole injection layer. An electron control layer may be disposed between the emission layers EL1 and EL2 and the second electrode CE. The electron control layer may include an electron transport layer, and may further include an electron injection layer. The hole control layer and the electron control layer may be commonly formed in a plurality of pixels PX (see FIG. 8) using an open mask.

An encapsulation layer ENL is disposed on the light emitting element LD to cover the light emitting element LD. The encapsulation layer ENL may be spaced apart from the light emitting element LD with a predetermined space GP therebetween to encapsulate the light emitting element LD. The space GP may be filled with air, an inert gas, or an adhesive material. The encapsulation layer ENL may be a glass substrate provided in the form of an encapsulation substrate.

The sensor layer TP may be disposed on the display panel DP. The sensor layer TP may be referred to as a sensor, an input sensing layer, or an input sensing panel. The sensor layer TP may include a base layer BS-T, a first conductive layer ML1, a sensing insulating layer PV1, a second conductive layer ML2, and a cover insulating layer PV2.

The base layer BS-T may be directly disposed on the display panel DP. The base layer BS-T may be an inorganic layer including at least any one among silicon nitride, silicon oxynitride, and silicon oxide. Alternatively, the base layer BS-T may be an organic layer including an epoxy resin, an acrylic resin, or an imide-based resin. The base layer BS-T may have a single-layered structure or may have a multi-layered structure stacked along the third direction DR3.

The first conductive layer ML1 and the second conductive layer ML2 each may have a single-layered structure or may have a multi-layered structure stacked along the third direction DR3. The first conductive layer ML1 and the second conductive layer ML2 may include conductive lines that define a sensing electrode in the form of a mesh. The conductive lines non-overlap the first opening PDL-OP1, the second opening PDL-OP2, and the openings PDP-OP1 and PDP-OP2, and overlap the pixel defining pattern PDP and the pixel defining film PDL. The sensing electrode defined by the first conductive layer ML1 and the second conductive layer ML2 overlaps at least the third region DP-A3 shown in FIG. 8.

The single-layered conductive layer may include a metal layer or a transparent conductive layer. The metal layer may include molybdenum, silver, titanium, copper, aluminum, or an alloy thereof. The transparent conductive layer may include a transparent conductive oxide such as indium tin oxide (ITO), indium zinc oxide (IZO), zinc oxide (ZnO), or indium zinc tin oxide (IZTO). In addition, the transparent conductive layer may include a conductive polymer such as PEDOT, a metal nanowire, graphene, etc.

The conductive layer having a multi-layered structure may include metal layers. The metal layers may have a three-layer structure of, for example, titanium/aluminum/titanium. The multi-layered conductive layer may include at least one metal layer and at least one transparent conductive layer.

At least one selected from the sensing insulating layer PV1 and the cover insulating layer PV2 may include an inorganic film. The inorganic film may include at least one selected from aluminum oxide, titanium oxide, silicon oxide, silicon oxynitride, zirconium oxide, and hafnium oxide.

At least one selected from the sensing insulating layer PV1 and the cover insulating layer PV2 may include an organic film. The organic film may include at least one selected from an acrylic-based resin, a methacrylate-based resin, polyisoprene, a vinyl-based resin, an epoxy-based resin, a urethane-based resin, a cellulose-based resin, a siloxane-based resin, a polyimide-based resin, a polyamide-based resin, and a perylene-based resin.

In an embodiment, at least one contact hole may be defined in the sensing insulating layer PV1, and the first conductive layer ML1 and the second conductive layer ML2 may be electrically connected through the contact hole.

In the display device DD according to an embodiment, the anti-reflection layer ARP disposed on an upper portion of the display panel DP may be a polarizing plate. The display device DD according to an embodiment may include a polarizing plate as the antireflection layer ARP. The antireflection layer ARP may be a polarizing plate including a linear polarizing layer and at least one phase delay layer. The anti-reflection layer ARP may be directly disposed on the sensor layer TP.

FIG. 12 is a cross-sectional view showing a portion of a display device according to an embodiment. FIG. 12 shows a cross-section of a portion of a display device, which corresponds to the first region DP-A1 of the display panel DP shown in FIG. 8.

Hereinafter, a "portion of a display device, which corresponds to the first region DP-A1" of the display panel DP is referred to as a "first region of the display device DD". Referring to FIG. 12, the display device DD according to an embodiment may include a display panel DP, an anti-reflection layer ARP disposed on the display panel DP, and a transmission layer TML disposed on the anti-reflection layer ARP. The first region of the display device DD may overlap the first portion TM1 of a transmission layer.

Although not shown in FIG. 12, a third adhesive layer AP3 (shown in FIG. 4) may be disposed between the display panel DP, and a second adhesive layer AP2 (shown in FIG. 4) may be disposed between the anti-reflection layer ARP and the transmission layer TML.

In an embodiment, the display panel DP may include a plurality of insulating layers, a semiconductor pattern, a conductive pattern, a metal pattern, and a signal line. In an embodiment, an insulating layer, a semiconductor layer, a conductive layer, and a metal layer may be formed by a method of coating, deposition, or the like. Subsequently, through a method of photolithography, the insulating layer, the semiconductor layer, the conductive layer, and the metal layer may be selectively patterned. In this way, the semiconductor pattern, the conductive pattern, the shielding pattern, the metal pattern, the signal line, and the like included in the circuit layer DP-CL and the light emitting element layer DP-ED are formed. Thereafter, the encapsulation layer ENL covering the light emitting element layer DP-ED may be formed.

The circuit layer DP-CL and a light emitting element layer DP-ED may be disposed on the base layer BL. The light emitting element LD included in the light emitting element layer DP-ED may include a first electrode AE, a second electrode CE, and an emission layer EML disposed between the first electrode AE and the second electrode CE. In addition, the light emitting element LD may include a hole transport region HTR disposed between the first electrode AE and the emission layer EML, and an electron transport region ETR disposed between the emission layer EML and the second electrode CE.

In such an embodiment, the circuit layer DP-CL disposed on the base layer BL and the light emitting element layer DP-ED are substantially the same as those described above with reference to FIGS. 10 and 11. Referring to FIGS. 10 to 12, the circuit layer DP-CL may include at least one metal pattern such as the rear metal layers BMLa and BMLb, the semiconductor patterns SP1 and SP2, the gates GT1 and GT2, or the connection electrodes CNE1 and CNE2, and the at least one metal pattern may not be disposed in the transmission region TP. The light transmittance of light passing through the antireflection layer ARP and the transmission layer TML overlapping the transmission region TP may be higher than the light transmittance of light passing through the antireflection layer ARP and the transmission layer TML overlapping the element region EA. The transmission region TP may not include a metal pattern such as the rear metal layers BMLa and BMLb, the semiconductor patterns SP1 and SP2, the gates GT1 and GT2, or the connection electrodes CNE1 and CNE2, as described above, and light signals may thus be easily delivered from the outside to the electronic module EM (shown in FIG. 4) disposed below the display device DD even when the anti-reflection layer ARP and the first portion TM1 of the transmission layer TML overlaps the transmission region TP.

Referring back to FIG. 12, the first electrode AE may be disposed on the circuit layer DP-CL. The first electrode AE may be an anode electrode. A pixel defining film may be disposed on the first electrode AE and the circuit layer DP-CL. An opening PX_OP for exposing a predetermined portion of the first electrode AE may be defined in the pixel defining film. In an embodiment, a portion of the pixel defining film disposed to correspond to the first region of the display device DD may be referred to as a first pixel defining portion PDL1.

The first pixel defining portion PDL1 may be formed of a polymer resin. In an embodiment, for example, the first pixel defining portion PDL1 may include or be formed of a polyacrylate-based resin or a polyimide-based resin. In addition, the first pixel defining portion PDL1 may further include an inorganic material in addition to the polymer resin. in an embodiment, the first pixel defining portion PDL1 may include or be formed of a light absorbing material, or may include or be formed of a black pigment or a black dye. The first pixel defining portion PDL1 including or formed of a black pigment or a black dye may implement a black pixel defining film. When forming the first pixel defining portion PDL1, carbon black may be used as a black pigment or a black dye, but the embodiment of the invention is not limited thereto.

The hole transport region HTR may be disposed on the first electrode AE and the pixel defining film PDL. The hole transport region HTR may be disposed to completely overlap the element region EA. That is, the hole transport region HTR may be commonly disposed in a first light emitting region EA-B and a non-light emitting region NPA included in the element region EA. The hole transport region HTR may include a hole transport layer and a hole injection layer. In an embodiment, the first light emitting region EA-B may generate blue light.

The emission layer EML may be disposed on the hole transport region HTR. The emission layer EML may be disposed in a region corresponding to the opening PX_OP. The emission layer EML may include an organic material and/or an inorganic material. In an embodiment shown in FIG. 12, the emission layer EML may be a portion that emits blue light.

The electron transport region ETR may be disposed on the emission layer EML and the hole transport region HTR. The electron transport region ETR may be disposed to completely overlap the element region EA. That is, the electron transport region ETR may be commonly disposed in a first light emitting region EA-B and a non-light emitting region NPA included in the element region EA. The electron transport region ETR may include an electron transport layer and an electron injection layer.

The second electrode CE may be disposed on the electron transport region ETR. The second electrode CE may be a cathode electrode. The second electrode CE may be provided as a common layer.

In an embodiment, the hole transport region HTR, the electron transport region ETR, and the second electrode CE are shown as extending to the non-light emitting region NPA, but the embodiment is not limited thereto, and the hole transport region HTR, the electron transport region ETR, and the second electrode CE may also be patterned to correspond to the light emitting region and provided.

A layer on which the light emitting element LD is disposed may be defined as the light emitting element layer DP-ED. The encapsulation layer ENL may be disposed on the light emitting element LD. The encapsulation layer ENL may be spaced apart from the light emitting element LD with a predetermined space GP therebetween to encapsulate the light emitting element LD. The encapsulation layer ENL may be a glass substrate provided in the form of an encapsulation substrate. However, the embodiment of the invention is not limited thereto, and the encapsulation layer ENL may be a thin film encapsulation layer including a plurality of organic thin films and inorganic thin films.

The first electrode AE and the second electrode CE may not overlap the transmission region TA. The encapsulation layer ENL may overlap the transmission region TA. In an embodiment, although not shown in the drawings, where the second electrode CE is a transparent electrode, at least a portion of the second electrode CE may overlap the transmission region TA.

The sensor layer TP may be disposed on the encapsulation layer ENL. The sensor layer TP may be directly disposed on the encapsulation layer ENL.

The sensor layer TP may include a base layer BS-T, a first conductive layer ML1, a sensing insulating layer PV1, a second conductive layer ML2, and a cover insulating layer PV2.

The base layer BS-T may be an inorganic layer including silicon nitride, silicon oxynitride, or silicon oxide. Alternatively, the base layer BS-T may be an organic layer including an epoxy resin, an acrylic resin, or an imide-based resin. The base layer BS-T may have a single-layered structure or may have a multi-layered structure stacked along the third direction DR3. The base layer BS-T may be directly disposed on the encapsulation layer ENL. Meanwhile, in an embodiment, the base layer BS-T may be omitted.

Each of the first conductive layer ML1 and the second conductive layer ML2 may have a single-layered structure or a multi-layered structure stacked in the third direction DR3.

The single-layered conductive layer may include a metal layer or a transparent conductive layer. The metal layer may include molybdenum, silver, titanium, copper, aluminum, or an alloy thereof. The transparent conductive layer may include a transparent conductive oxide such as indium tin oxide (ITO), indium zinc oxide (IZO), zinc oxide (ZnO), or indium tin zinc oxide (ITZO). In addition, the transparent conductive layer may include a conductive polymer such as PEDOT, a metal nanowire, graphene, etc.

The conductive layer having a multi-layered structure may include metal layers. The metal layers may have a three-layer structure of, for example, titanium/aluminum/titanium. The multi-layered conductive layer may include at least one metal layer and at least one transparent conductive layer.

The sensor layer TP may obtain information on external inputs through a change in mutual capacitance or obtain information on external inputs through a change in self-capacitance. In an embodiment, for example, the sensor layer TP may include sensing patterns and bridge patterns. At least some of the sensing patterns and bridge patterns may be included in the first conductive layer ML1, and at least some of the sensing patterns and bridge patterns may be included in the second conductive layer ML2.

At least one selected from the sensing insulating layer PV1 and the cover insulating layer PV2 may include an inorganic film. The inorganic film may include at least one selected from aluminum oxide, titanium oxide, silicon oxide, silicon oxynitride, zirconium oxide, and hafnium oxide.

At least one selected from the sensing insulating layer PV1 and the cover insulating layer PV2 may include an organic film. The organic layer may include at least ay one selected from an acrylic-based resin, a methacrylate-based resin, polyisoprene, a vinyl-based resin, an epoxy-based resin, a urethane-based resin, a cellulose-based resin, a siloxane-based resin, a polyimide-based resin, a polyamide-based resin, and a perylene-based resin.

In an embodiment, at least one contact hole may be defined in the sensing insulating layer PV1, and the first conductive layer ML1 and the second conductive layer ML2 may be electrically connected through the contact hole.

In the display device DD according to an embodiment, the anti-reflection layer ARP disposed on an upper portion of the display panel DP may be a polarizing plate. The display device DD according to an embodiment may include a polarizing plate as the antireflection layer ARP. The antireflection layer ARP may be a polarizing plate including a linear polarizing layer and at least one phase delay layer.

In the display device DD according to an embodiment, the transmission layer TML may be disposed on the anti-reflection layer ARP. In the first region of the display device DD, the first portion TM1 of the transmission layer TML may overlap.

Figure 13:
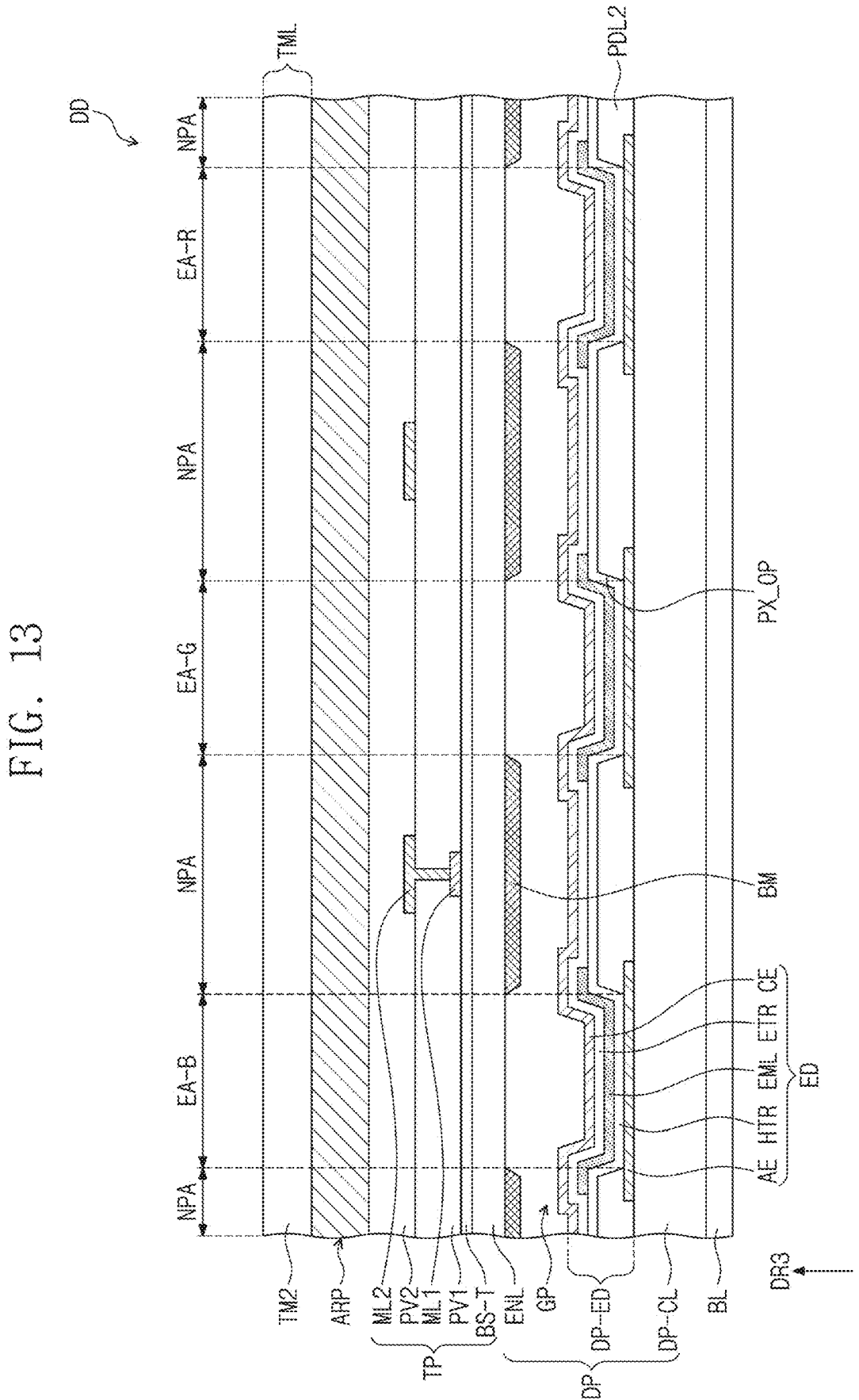

FIG. 13 is a cross-sectional view showing a portion of a second region in a display device according to an embodiment. FIG. 13 shows a cross-section of a portion of a display device, which corresponds to the second region DP-A2 of the display panel DP shown in FIG. 8. Hereinafter, a "portion of a display device, which corresponds to the second region DP-A2" of the display panel DP is referred to as a "second region of the display device DD". Referring to FIG. 13, the display device DD according to an embodiment, as described in FIG. 12, may include a display panel DP, an anti-reflection layer ARP disposed on the display panel DP, and a transmission layer TML disposed on the anti-reflection layer ARP. The second region of the display device DD may overlap the second portion TM2 of a transmission layer.

As shown in FIG. 13, the display panel DP of an embodiment may include three light emitting regions EA-B, EA-G, and a non-light emitting region NPA may be disposed between the adjacent light emitting regions EA-B, EA-G, and EA-R. In an embodiment, the first light emitting region EA-B may emit blue light, the second light emitting region EA-G may emit green light, and the third light emitting region EA-R may emit red light. However, the embodiment of the invention is not limited thereto, and blue light, green light, and red light may be changed to other three primary colors of light.

The display panel DP may include a base layer BL, a circuit layer DP-CL disposed on the base layer BL, and a light emitting element layer DP-ED In such an embodiment, the base layer BL, the circuit layer DP-CL, and the light emitting element layer DP-ED are substantially the same as those described above with reference to FIGS. 10 to 12. In such an embodiment, as described above, the light emitting element layer DP-ED may include a pixel defining film in which an opening PX_OP for exposing a predetermined portion of the first electrode AE is defined, and a portion of the pixel defining film disposed to correspond to the second region of the display device DD may be referred to as a second pixel defining portion PDL2. The features of the first pixel defining portion PDL1 described above may be equally applied to the second pixel defining portion PDL2.

The display device DD according to an embodiment may include a sensor layer TP, an anti-reflection layer ARP, and a transmission layer TML, which are sequentially disposed on the display panel DP. In an embodiment, the second portion TM2 of the transmission layer TML may overlap or correspond to the second region of the display device DD. The transmission layer TML may be an optically transparent polymer film. In an embodiment, the transmission layer TML may be a polyethylene terephthalate (PET) film or a polyimide (PI) film.

Referring to FIGS. 2 to 4, 12, and 13 together, in the electronic device ED according to an embodiment, the first portion TM1 and the second portion TM2 of the transmission layer TML may have different transmittances from each other. In the transmission layer TML, the first portion TM1 may have a transmittance lower than that of the second portion TM2.

In an embodiment, when the transmittance of the first portion TM1 is defined as a first transmittance, the transmittance of the second portion TM2 is defined as a second transmittance, reflectance of the first portion TM1 is defined as a first reflectance, and reflectance of the second portion TM2 is defined as a second reflectance, the first transmittance and the second transmittance may satisfy Equation 1 below.

$$T1(\%) = \sqrt{(R2(\%)/R1(\%))} \times T2(\%) \qquad \text{[Equation 1]}$$

In Equation 1 above, T1 denotes the first transmittance, T2 denotes the second transmittance, R1 denotes the first reflectance, and R2 denotes the second reflectance.

In an embodiment, the value of the first transmittance versus the second transmittance may be in a range of about 0.6 to about 0.9. In an embodiment, for example, the value of the first transmittance versus the second transmittance may be in a range of about 0.7 to about 0.75.

In the transmission layer TML, the first portion TM1 may include a dye or have a lower transmittance than the second portion TM2 through color control such as bleaching. In an embodiment, the second portion TM2 may not include a dye, and the first portion TM1 may include a dye and have a lower transmittance than the second portion TM2. Alternatively, the dye included in the first portion TM1 has a greater concentration than the dye included in the second portion TM2, and the first portion TM1 may thus have a lower transmittance than the second portion TM2.

In an embodiment, referring to FIGS. 12 and 13 together, the second region of the display device DD includes the light blocking pattern BM disposed to overlap at least a portion of the second region, but the light blocking pattern BM is not disposed in the first region of the display device DD. That is, as shown in FIG. 13, the light blocking pattern BM may be disposed to overlap only a portion of the second region of the display device DD and may not overlap the first region of the display device DD. The light blocking pattern BM may be disposed to overlap the non-light emitting region NPA.

The light blocking pattern BM may be disposed to overlap a portion of a pixel defining film. The light blocking pattern BM may overlap the second pixel defining portion PDL2 disposed in the second region of the display device DD, and may not overlap the first pixel defining portion PDL1 disposed in the first region of the display device DD.

The light blocking pattern BM may include or be formed of a light absorbing material, or may include or be formed of a black pigment or a black dye. The light blocking pattern BM may be disposed above the pixel defining film included in the display panel DP and the insulating layer, semiconductor patterns, and conductive patterns included in the circuit layer DP-CL disposed below the pixel defining film to improve black visibility of the display device DD. The light blocking pattern BM may be used to prevent external light from being reflected due to components disposed below.

The light blocking pattern BM may be disposed below the encapsulation layer ENL. As shown in FIG. 13, the light blocking pattern BM may be directly disposed on a lower surface of the encapsulation layer ENL. However, the arrangement of the light blocking pattern BM is not limited thereto, and the light blocking pattern BM may be disposed without limitation as long as the light blocking pattern BM is disposed above the lower components to prevent external light reflection. In an embodiment, for example, the light blocking pattern BM may be disposed above the encapsulation layer ENL. Alternatively, the light blocking pattern BM may be disposed above the sensor layer TP.

In the display device DD according to an embodiment, the light blocking pattern BM may be disposed to overlap only a portion of the second region of the display device DD and may not overlap the first region of the display device DD. The first region of the display device DD, that is, the region corresponding to the first region DP-A1 (shown in FIG. 8) of the display panel DP, overlaps the electronic module EM (shown in FIG. 4) as described above, and the light blocking patterns BM may thus non-overlap to improve the transmittance of light signals provided from the electronic module EM or light signals entering the electronic module EM. In an embodiment, where the light blocking pattern BM is not disposed, the first region of the display device DD may have greater reflectance for external light than the second region due to the components disposed below.

In the display device DD according to an embodiment, the transmission layer TML is disposed on the anti-reflection layer ARP, the first portion TM1 having a lower transmittance overlaps the first region of the display device DD on which the light blocking pattern BM is not disposed, and the second portion TM2 having a higher transmittance overlaps the second region of the display device DD on which the light blocking pattern BM is disposed to allow reflectance of the first region and the second region to be substantially equal to each other. Accordingly, even when the first region of the display device DD in which the light blocking pattern BM is not disposed has greater reflectance of external light due to components disposed below, the total reflectance of the first region and the second region may be controlled to be substantially equal to each other by the first portion TM1 having a lower transmittance. Accordingly, there may be no difference or a minimal difference in reflectance between the portion corresponding to the first region DP-A1 (FIG. 8) of the display panel DP and the portion corresponding to the second region DP-A2 (FIG. 8) of the display panel DP, and the issue that a boundary between regions is visually perceived from the outside due to the difference in reflectance may be effectively prevented.

Figure 14:
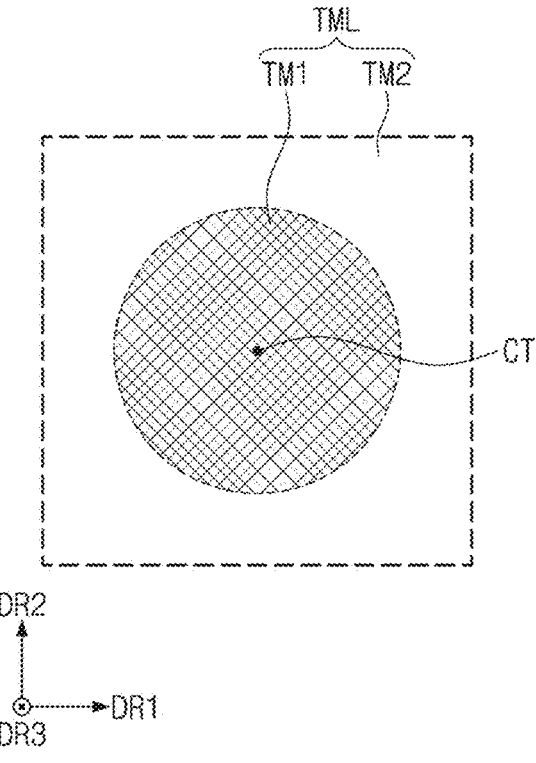
FIGS. 14 and 15 are each a plan view showing a portion of a transmission layer according to an embodiment of the invention.
Figure 15:
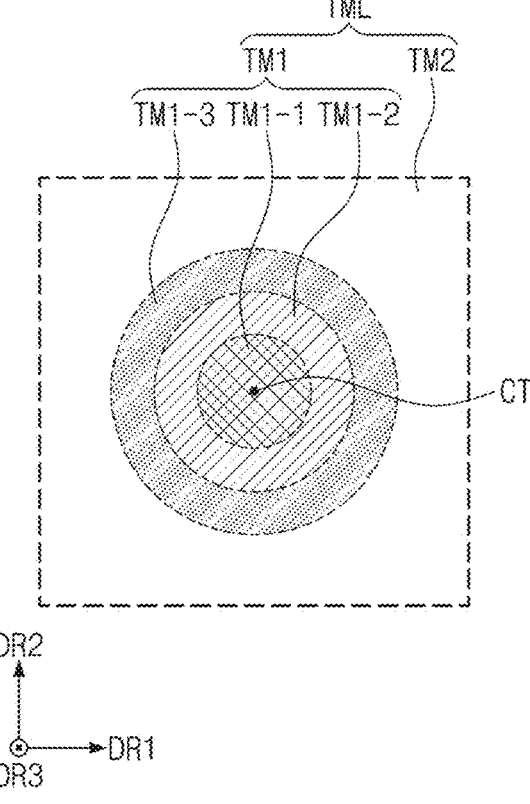

FIGS. 14 and 15 are each a plan view of showing a portion of a transmission layer according to an embodiment of the invention. Hereinafter, in describing the transmission layer TML according to an embodiment with reference to FIGS.

14 to 15, the same or like reference numerals are given for the same or like components as those described above, and any repetitive detailed descriptions thereof will be omitted.

Referring to FIGS. 14 and 15, the first portion TM1 included in the transmission layer TML may have a circular shape when viewed on a plane. The first portion TM1 may have a circular shape having a constant diameter with respect to a center CT of the first portion TM1. However, the embodiment of the invention is not limited thereto, and the first portion TM1 may be variously shaped without being limited as long as the first portion TM1 corresponds to the first region DP-A1 (FIG. 8) of the display panel DP (FIG. 8). In an embodiment, for example, the first portion TM1 may have an elliptical shape or a rectangular shape when viewed on a plane.

Referring to FIG. 15, the first portion TM1 may include a plurality of sub-portions TM1-1, TM1-2, and TM1-3, and the plurality of sub-portions TM1-1, TM1-2, and TM1-3 may have different transmittances from each other. In an embodiment, for example, the first portion TM1 may include a first sub-portion TM1-1 adjacent to the center CT of the first portion TM1, a second sub-portion TM1-2 spaced further from the center CT than the first sub-portion TM1-1, and a third sub-portion TM1-3 spaced further from the center CT than the first sub-portion TM1-1 and the second sub-portion TM1-2, and the first sub-portion TM1-1, the second sub-portion TM1-2, and the third sub-portion TM1-3 may have different transmittances from each other. In an embodiment, the transmittance of the first portion TM1 may gradually increase from the center CT of the first portion TM1 to the second portion TM2. That is, the transmittance of the third sub-portion TM1-3 placed closest to the second portion TM2 may be greater than the transmittance of each of the first sub-portion TM1-1 and the second sub-portion TM1-2. The transmittance of the second sub-portion TM1-2 may be greater than that of the first sub-portion TM1-1 placed closest to the center CT. In such an embodiment where the transmittance is designed to gradually increase from the center CT of the first portion TM1 included in the transmission layer TML to the second portion TM2, contrast sensitivity may be reduced at the boundary between the first portion TM1 and the second portion TM2, and accordingly, the boundary between the first region DP-A1 (FIG. 8) of the display panel DP (FIG. 8), which overlaps the first portion TM1 and the second region DP-A2 (FIG. 8) of the display panel DP (FIG. 8), which overlaps the second portion TM2 may not be visually perceived from the outside.

Hereinafter, with reference to specific Examples and Comparative Examples, a display device according to an embodiment of the invention and an electronic device including the display device will be described in detail. However, Examples shown below are illustrated only for the understanding of the invention, and the scope of the invention is not limited thereto.

Table 1 below shows reflectance in each component of the electronic devices of Example and Comparative Example and reflectance throughout the display device. In Table 1, as shown in FIG. 4, in the electronic device of Example, reflectance of each component for the electronic device in which a transmission layer TML was disposed on an anti-reflection layer ARP and reflectance throughout the display device are shown. Unlike the electronic device of Example, the electronic device of Comparative Example showed reflectance of each component and reflectance throughout the display device when a window was disposed without a separate transmission layer disposed on the anti-reflection layer. That is, in the electronic device of Example, the reflectance of each component and the reflectance throughout the display device are shown for an electronic device having a stack structure of "first component: window", "second component: adhesive layer (first adhesive layer)", third component: transmission layer/anti-reflection layer/display panel", and in the electronic device of Comparative Example, the reflectance of each component and the reflectance throughout the display device are shown for an electronic device having a stack structure of "first configuration: window", "second component: adhesive layer (first adhesive layer)", "third component: anti-reflection layer/display panel". In the electronic device of Example, the transmittance of the first portion included in the transmission layer was manufactured to have a value of 0.721 compared to the transmittance of the second portion.

TABLE 1

| Item | Stack structure | Reflectance (%) | |
| | | Inside of sensing region | Outside of sensing region |
| --- | --- | --- | --- |
| Example | Upper surface of window | 4.28 | 4.28 |
| | Inside of window and upper surface of adhesive layer | 0.02 | 0.02 |
| | Inside of adhesive layer and upper surface of transmission layer | 0.02 | 0.02 |
| | Inside of transmission layer/anti-reflection layer/display panel | 0.16 | 0.16 |
| | Total reflectance | 4.48 | 4.48 |
| Comparative Example | Upper surface of window | 4.28 | 4.28 |
| | Inside of window and upper surface of adhesive layer | 0.02 | 0.02 |
| | Inside of adhesive layer and upper surface of anti-reflection layer | 0.02 | 0.02 |
| | Inside of anti-reflection layer/display panel | 0.26 | 0.16 |
| | Total reflectance | 4.58 | 4.48 |

Referring to the above descriptions and the results of Table 1, in the case of the electronic device of Comparative Example, a light blocking pattern is not included in a portion of a display panel overlapping a sensing region, and a light blocking pattern is included in a portion of a display panel non-overlapping a sensing region, and accordingly, inside the component of "anti-reflection layer/display panel", a difference in reflectance between the inside of the sensing region and the outside of the sensing region is caused. Accordingly, throughout the electronic device, a difference in the reflectance between the inside of the sensing region and the outside of the sensing region may also be caused, and the difference in reflectance may cause a boundary of the sensing region to be visually perceived from the outside. On the other hand, in the case of the electronic device of Example, a transmission layer in which transmittance of a first portion overlapping the sensing region and transmittance of a second portion non-overlapping the sensing region are differently applied is included, and accordingly, inside the component of "transmission layer/anti-reflection layer/display panel", a difference in reflectance between the inside of the sensing region and the outside of the sensing region may be effectively prevented. Accordingly, a difference in reflectance between the inside of the sensing region and the outside of the sensing region is not caused throughout the electronic device, and the boundary of the sensing region may thus be effectively prevented from being visually perceived from the outside.

According to embodiments of the invention, in a sensing region of a display panel overlapping a portion where an electronic module is disposed, a light blocking pattern is omitted to have improved transmittance, and a difference in reflectance between the sensing region and a non-sensing region due to the omission of the light blocking pattern may be effectively prevented by using a transmission layer including a transmittance control portion. Accordingly, a boundary between the sensing region and the non-sensing region may not be visually perceived from the outside, and an electronic device may thus have improved visibility.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:

a display panel including a display region having a first region and a second region positioned adjacent to the first region, and a peripheral region positioned adjacent to the display region;

a light blocking pattern overlapping at least a portion of the second region and not overlapping the first region; and a transmission layer disposed on the light blocking pattern and including a first portion overlapping the first region and a second portion overlapping the second region, wherein a lower surface of the first portion and a lower surface of the second portion are co-planar, wherein the lower surfaces of the first and second portions are nearer to the display panel than upper surfaces thereof, and wherein a transmittance of the first portion is lower than a transmittance of the second portion.

2. The display device of claim 1, further comprising:

an anti-reflection layer disposed between the transmission layer and the light blocking pattern.

3. The display device of claim 1, wherein the transmittance of the first portion is defined as a first transmittance, the transmittance of the second portion is defined as a second transmittance, a reflectance of the first portion is defined as a first reflectance, a reflectance of the second portion is defined as a second reflectance, and the first transmittance and the second transmittance satisfy the following Equation:

$$T1(\%) = \sqrt{(R2(\%)/R1(\%))} \times T2(\%)$$

wherein

T1 denotes the first transmittance,

T2 denotes the second transmittance,

R1 denotes the first reflectance, and

R2 denotes the second reflectance.

4. The display device of claim 3, wherein a ratio of the first transmittance to the second transmittance is in a range of about 0.6 to about 0.9.

5. The display device of claim 1, wherein the first portion has a circular shape when viewed on a plane, and the transmittance of the first portion increases as being away from a center of the first portion towards the second portion.

6. The display device of claim 1, further comprising:

a window disposed on the transmission layer;

a first adhesive layer disposed between the window and the transmission layer; and a second adhesive layer disposed between the transmission layer and the display panel.

7. The display device of claim 1, wherein the display panel comprises:

a base layer;

a plurality of pixels disposed on the base layer, wherein the plurality of pixels emits light in the display region; and an encapsulation layer disposed on the base layer and covering the plurality of pixels, wherein the light blocking pattern is disposed below the encapsulation layer.

8. The display device of claim 7, further comprising:

a sensor layer disposed on the encapsulation layer, wherein the sensor layer includes a plurality of conductive patterns and at least one sensing insulating layer disposed between the conductive patterns.

9. The display device of claim 7, wherein the plurality of pixels includes a plurality of light emitting elements, the display panel further comprises a pixel defining film, in which a plurality of light emitting openings is defined, wherein the plurality of light emitting elements are disposed in the plurality of light emitting openings, and the light blocking pattern is disposed to overlap the pixel defining film in the second region.

10. The display device of claim 9, wherein the pixel defining film comprises:

a first pixel defining portion overlapping the first region; and a second pixel defining portion overlapping the second region, wherein the light blocking pattern does not overlap the first pixel defining portion and overlaps the second pixel defining portion.

11. The display device of claim 7, wherein the plurality of pixels comprises:

a first pixel including a first light emitting element disposed in the first region; and a second pixel including a second light emitting element disposed in the second region, wherein a number of the first light emitting elements per unit area is less than a number of the second light emitting elements per unit area.

12. The display device of claim 1, wherein a reflectance corresponding to the first region and a reflectance corresponding to the second region are substantially equal to each other.

13. The display device of claim 1, wherein the first portion and the second portion are integrally formed with each other as a single unitary an indivisible body.

14. A display device comprising:

a display panel including a display region having a first region and a second region positioned adjacent to the first region, and a peripheral region positioned adjacent to the display region;

a light blocking pattern overlapping at least a portion of the second region;

an anti-reflection layer disposed on the light blocking pattern;

a transmission layer disposed on the anti-reflection layer and including a first portion overlapping the first region and a second portion overlapping the second region; and a window disposed on the transmission layer, wherein a lower surface of the first portion and a lower surface of the second portion are co-planar, wherein the lower surfaces of the first and second portions are nearer to the display panel than upper surfaces thereof, and wherein a transmittance of the first portion is lower than a transmittance of the second portion.

15. The display device of claim 14, wherein the display panel comprises:

a base layer;

a plurality of pixels disposed on the base layer, wherein the plurality of pixels emits light in the display region; and an encapsulation layer disposed on the base layer and covering the plurality of pixels, wherein the light blocking pattern is disposed below the encapsulation layer.

16. The display device of claim 15, further comprising:

a sensor layer disposed on the encapsulation layer, wherein the sensor layer includes a plurality of conductive patterns and at least one sensing insulating layer disposed between the conductive patterns.

17. An electronic device comprising:

a display device including a display region having a first region, through which light signals pass, and a second region positioned adjacent to the first region, and a peripheral region positioned adjacent to the display region; and an electronic module disposed below the display device and overlapping the first region, wherein the electronic module receives the light signals, wherein the display device includes:

a display panel;

a light blocking pattern overlapping at least a portion of the second region; and a transmission layer disposed on the light blocking pattern and including a first portion overlapping the first region and a second portion overlapping the second region, wherein a lower surface of the first portion and a lower surface of the second portion are co-planar, wherein the lower surfaces of the first and second portions are nearer to the display panel than upper surfaces thereof, and wherein a transmittance of the first portion is lower than a transmittance of the second portion.

18. The electronic device of claim 17, wherein the electronic module comprises a camera module.

19. The electronic device of claim 17, wherein the display device further comprises:

an anti-reflection layer disposed between the transmission layer and the light blocking pattern;

a window disposed on the transmission layer;

a first adhesive layer disposed between the window and the transmission layer; and a second adhesive layer disposed between the transmission layer and the anti-reflection layer.

20. The electronic device of claim 17, wherein the transmittance of the first portion is defined as a first transmittance, the transmittance of the second portion is defined as a second transmittance, and a ratio of the first transmittance to the second transmittance is in a range of about 0.6 to about 0.9.

* * * * *